United States Patent
Katkar

(10) Patent No.: US 11,069,734 B2
(45) Date of Patent: Jul. 20, 2021

(54) IMAGE SENSOR DEVICE

(71) Applicant: Invensas Corporation, San Jose, CA (US)

(72) Inventor: Rajesh Katkar, Milpitas, CA (US)

(73) Assignee: INVENSAS CORPORATION, San Jose, CA (US)

( * ) Notice: Subject to any disclaimer, the term of this patent is extended or adjusted under 35 U.S.C. 154(b) by 85 days.

(21) Appl. No.: 16/513,489

(22) Filed: Jul. 16, 2019

(65) Prior Publication Data

US 2019/0348459 A1 Nov. 14, 2019

Related U.S. Application Data

(60) Continuation-in-part of application No. 16/370,747, filed on Mar. 29, 2019, now Pat. No. 10,847,562.
(Continued)

(51) Int. Cl.
*H01L 27/146* (2006.01)
*H01L 21/768* (2006.01)
(Continued)

(52) U.S. Cl.
CPC .. *H01L 27/14634* (2013.01); *H01L 21/76898* (2013.01); *H01L 23/481* (2013.01);
(Continued)

(58) Field of Classification Search
CPC ......... H01L 27/14634; H01L 27/14618; H01L 27/14636; H01L 27/1464; H01L 27/14687; H01L 27/1469
See application file for complete search history.

(56) References Cited

U.S. PATENT DOCUMENTS 5,051,802 A 9/1991 Prost et al.
7,582,971 B2 9/2009 Kameyama et al.
(Continued)

FOREIGN PATENT DOCUMENTS

| EP | 1011133 A1 | 6/2000 |
| JP | 2008130603 A | 6/2008 |
| JP | 2008112101 A2 | 9/2008 |

OTHER PUBLICATIONS

International Search Report and Written Opinion for PCT Application No. PCT/US2015/063239, dated Feb. 23, 2016, Applicant: Invensas Corporation, 16 pages.

*Primary Examiner* — Mark W Tornow
(74) *Attorney, Agent, or Firm* — Knobbe, Martens, Olson & Bear LLP

(57) ABSTRACT

Methods of forming a back side image sensor device, as well as back side image sensor devices formed, are disclosed. In one such a method, an image sensor wafer having a first dielectric layer with a first surface is obtained. A reconstituted wafer having a processor die and a second dielectric layer with a second surface is obtained. The reconstituted wafer and the image sensor wafer are bonded to one another including coupling the first surface of the first dielectric layer and the second surface of the second dielectric layer. In another method, such formation is for a processor die bonded to an image sensor wafer. In yet another method, such formation is for a processor die bonded to an image sensor die.

20 Claims, 24 Drawing Sheets

Related U.S. Application Data which is a continuation of application No. 15/875,067, filed on Jan. 19, 2018, now Pat. No. 10,269,853, which is a division of application No. 14/945,292, filed on Nov. 18, 2015, now Pat. No. 9,899,442.

(60) Provisional application No. 62/090,788, filed on Dec. 11, 2014.

(51) Int. Cl.
  *H01L 23/00* (2006.01)
  *H01L 23/48* (2006.01)

(52) U.S. Cl.
  CPC .......... *H01L 24/18* (2013.01); *H01L 27/1464* (2013.01); *H01L 27/1469* (2013.01); *H01L 27/14618* (2013.01); *H01L 27/14636* (2013.01); *H01L 27/14687* (2013.01); *H01L 2224/04105* (2013.01); *H01L 2224/12105* (2013.01); *H01L 2224/18* (2013.01); *H01L 2224/19* (2013.01); *H01L 2224/32145* (2013.01); *H01L 2224/73267* (2013.01); *H01L 2924/15153* (2013.01); *H01L 2924/16235* (2013.01)

(56) References Cited

U.S. PATENT DOCUMENTS

| | | |
|---|---|---|
| 7,663,231 B2 | 2/2010 | Chang et al. |
| 7,759,751 B2 | 7/2010 | Ono |
| 8,168,458 B2 | 5/2012 | Do et al. |
| 8,193,632 B2 | 6/2012 | Chang et al. |
| 8,263,434 B2 | 9/2012 | Pagaila et al. |
| 8,618,659 B2 | 12/2013 | Sato et al. |
| 8,791,575 B2 | 7/2014 | Oganesian et al. |
| 8,878,353 B2 | 11/2014 | Haba et al. |
| 9,136,293 B2 | 9/2015 | Yee et al. |
| 9,252,172 B2 | 2/2016 | Chow et al. |
| 9,476,898 B2 | 10/2016 | Takano |
| 10,269,853 B2 | 4/2019 | Katkar et al. |
| 2006/0087042 A1 | 4/2006 | Kameyama et al. |
| 2008/0308928 A1* | 12/2008 | Chang .................... H01L 24/24 257/723 |
| 2010/0167534 A1 | 7/2010 | Iwata |
| 2012/0187516 A1* | 7/2012 | Sato .................. H01L 27/14634 257/443 |
| 2012/0194719 A1 | 8/2012 | Churchwell et al. |
| 2015/0064498 A1* | 3/2015 | Tong ...................... H01L 24/29 428/688 |

* cited by examiner

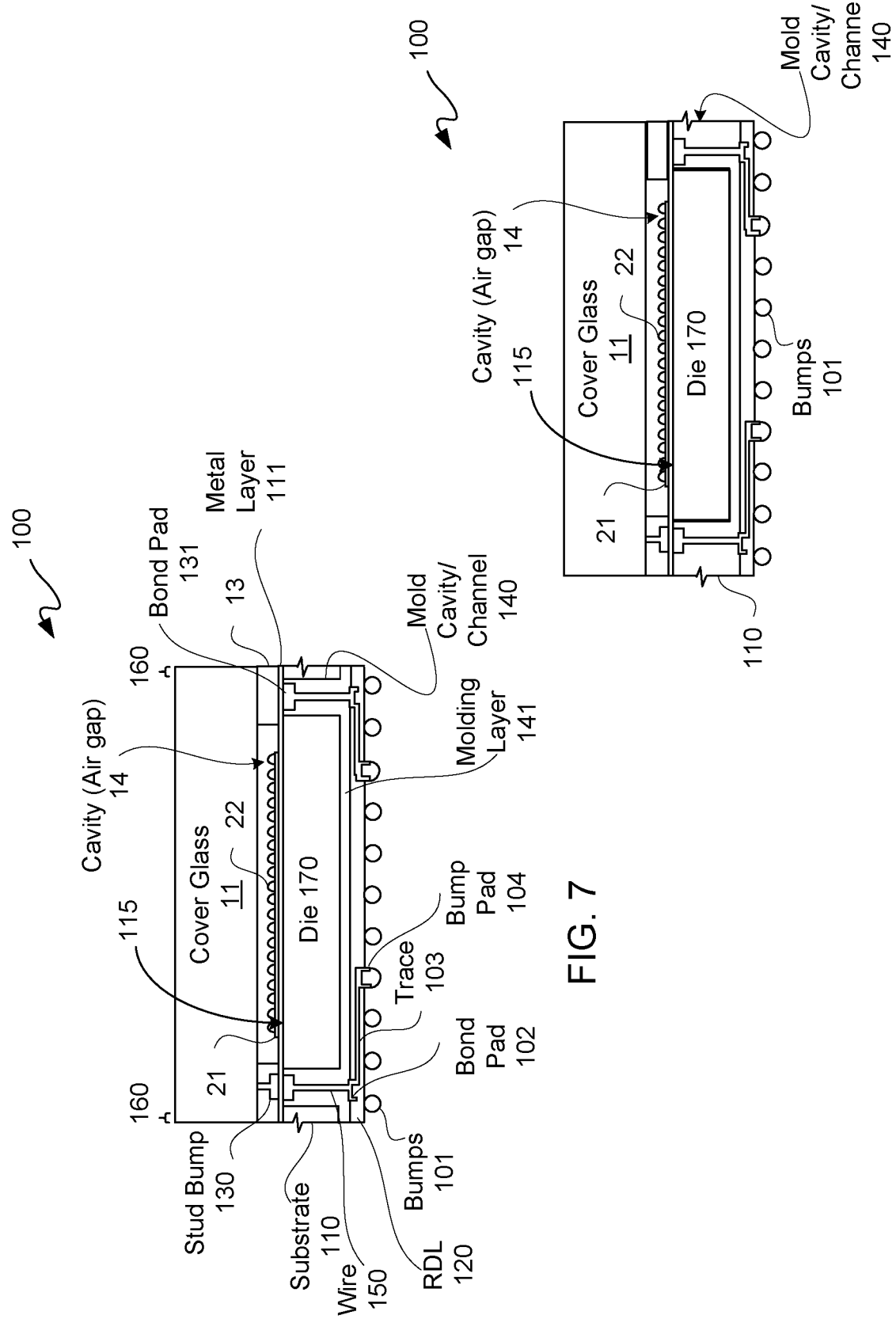

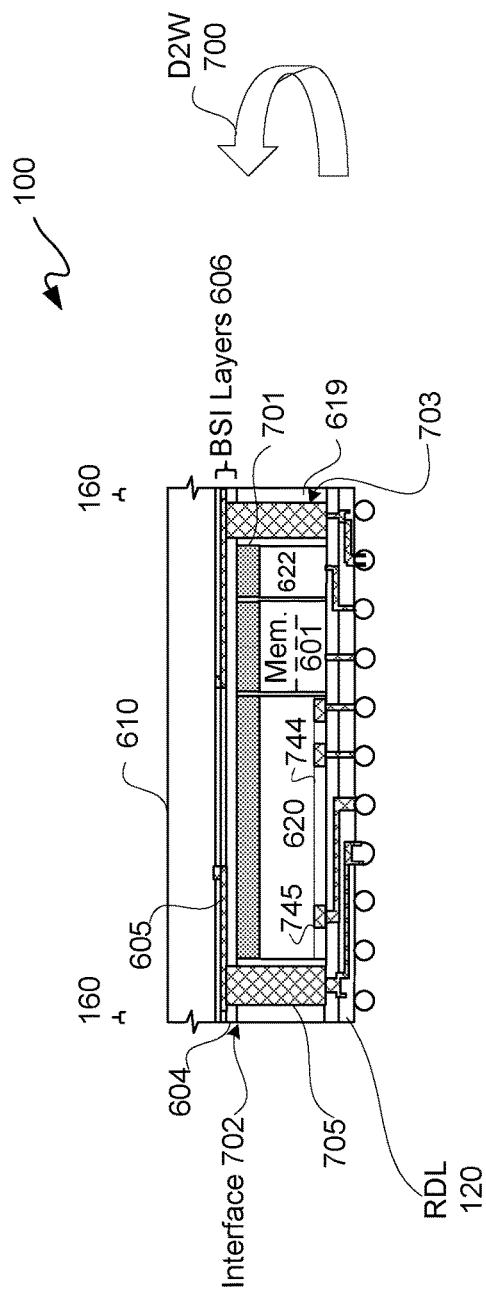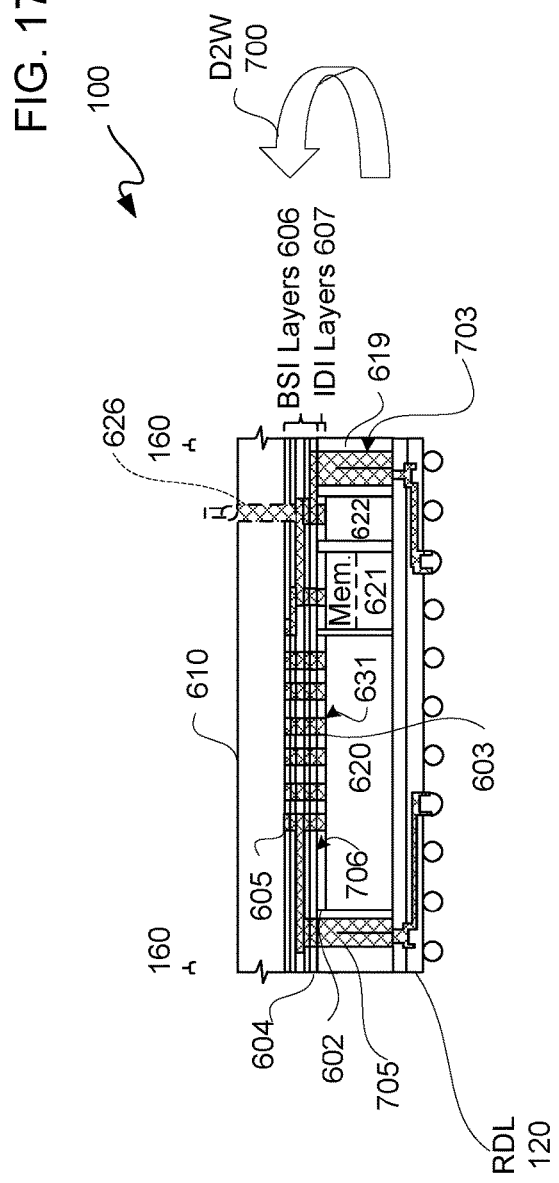

IMAGE SENSOR DEVICE

CROSS-REFERENCE TO RELATED APPLICATION(S)

This application is a continuation-in-part of and hereby claims priority to U.S. patent application Ser. No. 16/370,747, filed Mar. 29, 2019, which is a continuation of U.S. patent application Ser. No. 15/875,067 (now U.S. Pat. No. 10,269,853), filed Jan. 19, 2018, which is a divisional of U.S. patent application Ser. No. 14/945,292 (now U.S. Pat. No. 9,899,442), filed Nov. 18, 2015, which claims priority to U.S. Provisional Application No. US 62/090,788, filed Dec. 11, 2014, and the entirety of each of the above-mentioned is hereby incorporated by reference herein for all purposes.

FIELD

The following description relates to integrated circuits ("ICs"). More particularly, the following description relates to an image sensor device.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active device. Furthermore, an interposer may be formed like a PWB, namely without any circuit elements, such as passive devices including inductors, capacitors and resistors, or active devices. Additionally, an interposer includes at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, a die stacking configuration, or a more convenient or accessible position of bond pads for example.

Conventionally, an image sensor device, such as for a digital camera, is coupled to a separate controller chip ("controller"), such as to control sensor sensing time (exposure time), thresholds, and/or other features. An image sensor device may further be coupled to a separate driver chip and a separate image processor chip, as is known. Such controller may further be coupled to a motor for adjusting focus and/or electronic aperture, among other camera components. Distance between an image sensor device and a separate chip coupled thereto, such as a controller or image sensor for example, of a camera causes an amount of signal propagation delay. This delay can negatively impact performance of a camera.

Accordingly, it would be desirable and useful to provide a camera with less propagation time between an image sensor device and a separate chip coupled thereto.

BRIEF SUMMARY

A method relates generally to formation of a back side image sensor device. In such a method, an image sensor wafer having a first dielectric layer with a first surface is obtained. A reconstituted wafer having a processor die and a second dielectric layer with a second surface is obtained. The reconstituted wafer and the image sensor wafer are bonded to one another including coupling the first surface of the first dielectric layer and the second surface of the second dielectric layer.

Another method relates generally to formation of a back side image sensor device. In such a method, an image sensor wafer having a first dielectric layer with a first surface is obtained. A processor die having a second dielectric layer with a second surface is obtained. The first dielectric layer includes a first plurality of metallic pads of a first metal layer. The second dielectric layer includes a second plurality of metallic pads of a second metal layer. The processor die and the image sensor wafer are bonded to one another including coupling the first surface of the first dielectric layer and the second surface of the second dielectric layer to one another. The coupling includes interconnecting first surfaces of the first plurality of metallic pads of the first surface and second surfaces of the second plurality of metallic pads of the second surface directly to one another for electrical connectivity.

Yet another method relates generally to formation of a back side image sensor device. In such a method, an image sensor wafer having a first dielectric layer with a first surface is obtained. A processor die having a second dielectric layer with a second surface is obtained. The first dielectric layer includes a first plurality of metallic pads of a first metal layer. The second dielectric layer includes a second plurality of metallic pads of a second metal layer. The processor die has a third surface opposite the second surface. The processor die and the image sensor wafer are bonded to one another including coupling the first surface of the first dielectric layer of the image sensor wafer and the third surface of the processor die.

Still yet another method relates generally to formation of a back side image sensor device. In such a method, an image sensor die having a first dielectric layer with a first surface is obtained. A processor die having a second dielectric layer with a second surface is obtained. The first dielectric layer includes a first plurality of metallic pads of a first metal layer. The second dielectric layer includes a second plurality of metallic pads of a second metal layer. The processor die and the image sensor die are bonded to one another including coupling the first surface of the first dielectric layer and the second surface of the second dielectric layer to one another. The coupling includes interconnecting first surfaces of the first plurality of metallic pads of the first surface and second surfaces of the second plurality of metallic pads of the second surface directly to one another for electrical connectivity.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIG. 7 is a cross-sectional side view illustratively depicting an exemplary image sensor device with dicing lanes for sensor dies in a substrate.

FIG. 8 is a cross-sectional side view illustratively depicting an exemplary image sensor device with dicing lanes in mold cavities.

FIGS. 17-1 through 17-9 are respective cross-sectional side views illustratively depicting examples of a "back side" image sensor device.

FIG. 18-1 is a block diagram illustratively depicting an example of a wafer-to-wafer bonding operation.

FIG. 18-2 is a block diagram illustratively depicting an example of a die-to-wafer bonding operation, FIG. 18-3 is a block diagram illustratively depicting an example of another die-to-wafer bonding operation.

FIG. 18-4 is a block diagram illustratively depicting an example of a die-to-die bonding operation.

FIG. 18-5 is a block diagram illustratively depicting an example of a die-to-die bonding operation.

FIGS. 19-1 through 19-3 are respective flow diagrams depicting respective examples of assembly flows.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Figure 1:
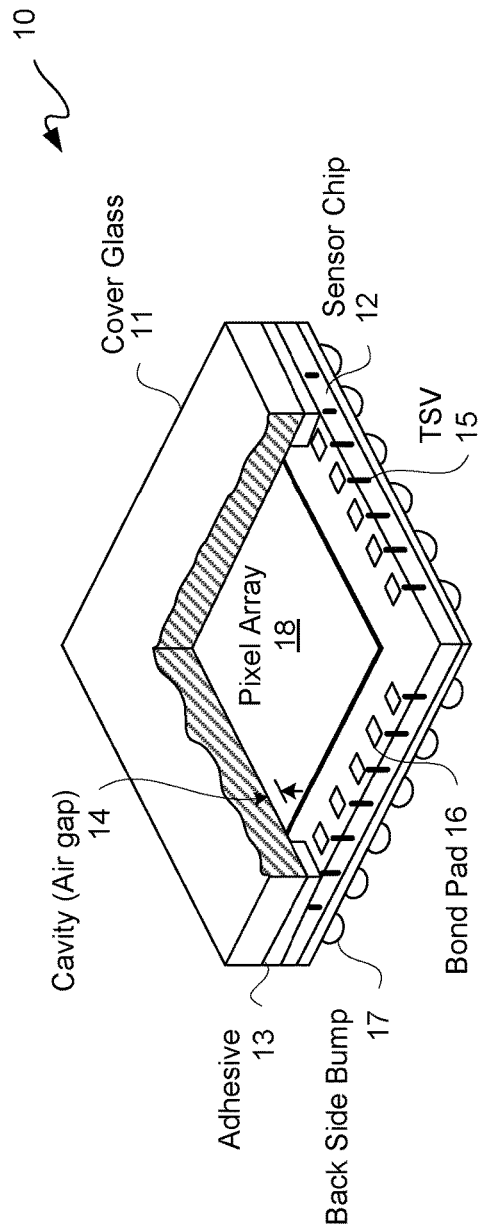
FIG. 1 is a top-down perspective and cut-away view illustratively depicting an exemplary conventional image sensor device.
Figure 2:
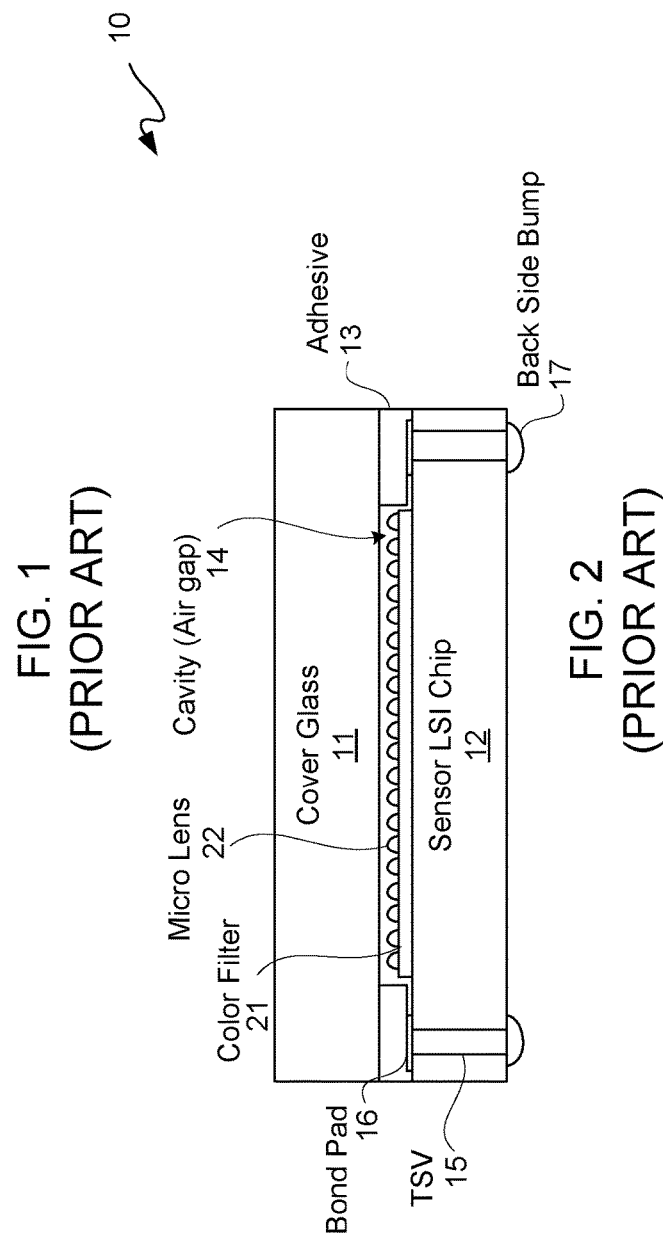
FIG. 2 is a cross-sectional side view illustratively depicting an exemplary the conventional image sensor device of FIG. 1.
Figure 3:
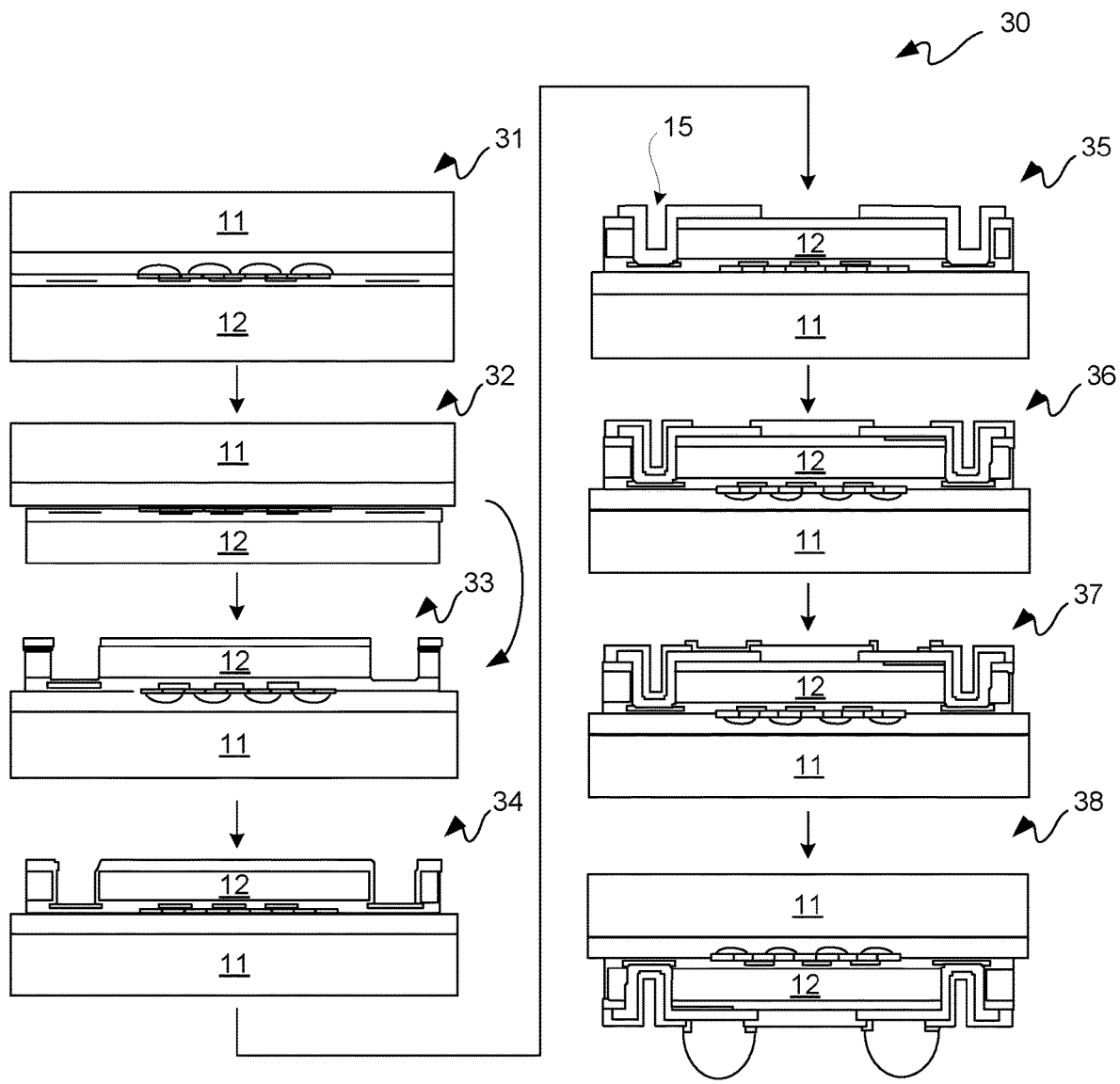
FIG. 3 is a progression of cross-sectional side views illustratively depicting an exemplary conventional process flow, which may be used to form the conventional image sensor device of FIGS. 1 and 2 for a bulk substrate device.

Before a detailed description is provided, a more detailed description of the context of the prior art may be useful. Along those lines, FIG. 1 is a top-down perspective and cut-away view illustratively depicting an exemplary conventional image sensor device 10. FIG. 2 is a cross-sectional side view illustratively depicting the conventional image sensor device 10 of FIG. 1. FIG. 3 is a progression of cross-sectional side views illustratively depicting an exemplary conventional process flow 30, which may be used to form the conventional image sensor device 10 of FIGS. 1 and 2. As image sensor device 10 and process flow 30 are known, unnecessary detail in the description thereof is not provided for purposes of clarity and not limitation.

Generally, with reference to FIGS. 1-3, a transparent cover sheet, such as a sheet of glass ("cover glass") 11 for example, and a large-scale integration ("LSI") image sensor chip or die ("substrate" or "sensor chip") 12 having a pixel array 18 are attached to one another with an adhesive 13 defining a cavity 14 between them. In the cavity 14, there is/are one or more micro lenses ("micro lens") 22 on one or more color filters ("color filter") 21. The color filter 21 may be on a front side surface of an LSI image sensor chip or die 12 ("substrate" or "silicon"). There may be a slight gap between a lower surface of the cover sheet ("cover glass" or "glass") 11 and an upper surface of the micro lens 22.

In process 30, after attaching or bonding at 31, there may be a back-grinding and stress relieving of the substrate 12 at 32, where the glass 11 may be used as a carrier. The substrate 12 may be flipped over and via etched at 33, followed by formation of via insulation at 34 and via metalization at 35 to form through substrate vias, such as through silicon vias ("TSVs") 15 for example. On a back side surface of the substrate 12, via metalization of such TSVs 15 may be passivated at 36 followed by under-bump metalization at 37 to form bond pads 16 including any redistribution layers and then forming of external interconnects ("bumping") at 38, such as to form back side bumps 17. Because bumps 17 of bumping are interconnected to TSVs 15 of the substrate 12, a separate controller die or chip (not shown in FIGS. 1 and 2) is conventionally coupled alongside of or otherwise spatially removed from a package of image sensor device 10.

Figure 4:
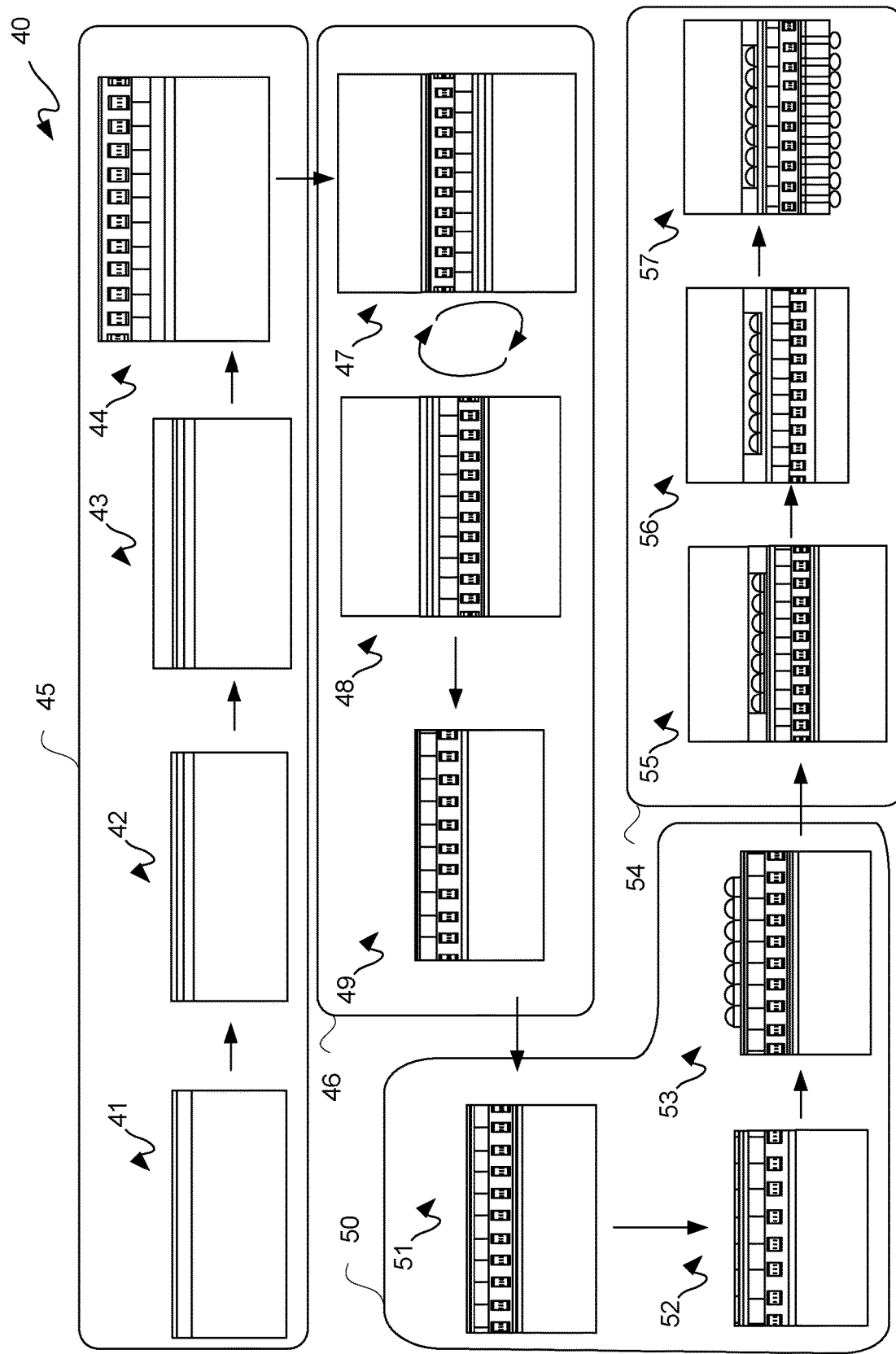
FIG. 4 is a progression of cross-sectional side views illustratively depicting an exemplary conventional process flow, which may be used to form the conventional image sensor device of FIGS. 1 and 2 though for a substrate-on-insulator substrate device.

While process flow 30 is for a bulk silicon substrate 12, one or more other semiconductive material(s) may be used for such substrate 12. Furthermore, rather than a bulk substrate 12, a substrate on insulator wafer may be used, such as for example a silicon on insulator ("SOI") wafer. Along those lines, FIG. 4 is a progression of cross-sectional side views illustratively depicting an exemplary conventional process flow 40, which may be used to form back side illuminated (BSI) image sensor device 10 of FIGS. 1 and 2, though for an SOI device. This formation may be done with wafer-level packaging ("WLP"). As process flow 40 is known, unnecessary detail in the description thereof is not provided for purposes of clarity and not limitation.

Operations 45 are for Front-End Of Line ("FEOL") processing. At 41, an SOI wafer is obtained. At 42, gradient implants are implanted into the wafer. At 43, epitaxial growth and annealing is performed. At 44, pixel and photo diode processing is performed.

Operations 46 are for Back-End Of Line ("BEOL") processing. At 47, bonding to a final carrier is performed. At 48, the wafer and carrier is flipped over. At 49, back side grinding or other thinning of the SOI wafer is performed down to the buried oxide layer ("BOX") to expose a back or underside of the SOI wafer. This operation at 49 may include laser annealing.

Operations 50 are for forming optical components. At 51, one or more anti-reflective ("AR") coatings are deposited. At 52, color filters are formed. At 53, microlenses are formed.

Operations 54 are "packaging" operations. At 55, glass is bonded to the wafer. At 56, front side grinding or other thinning of the carrier is performed. At 57, TSVs for a three dimensional package or a WLP are formed followed by formation of bumps.

Figure 6:
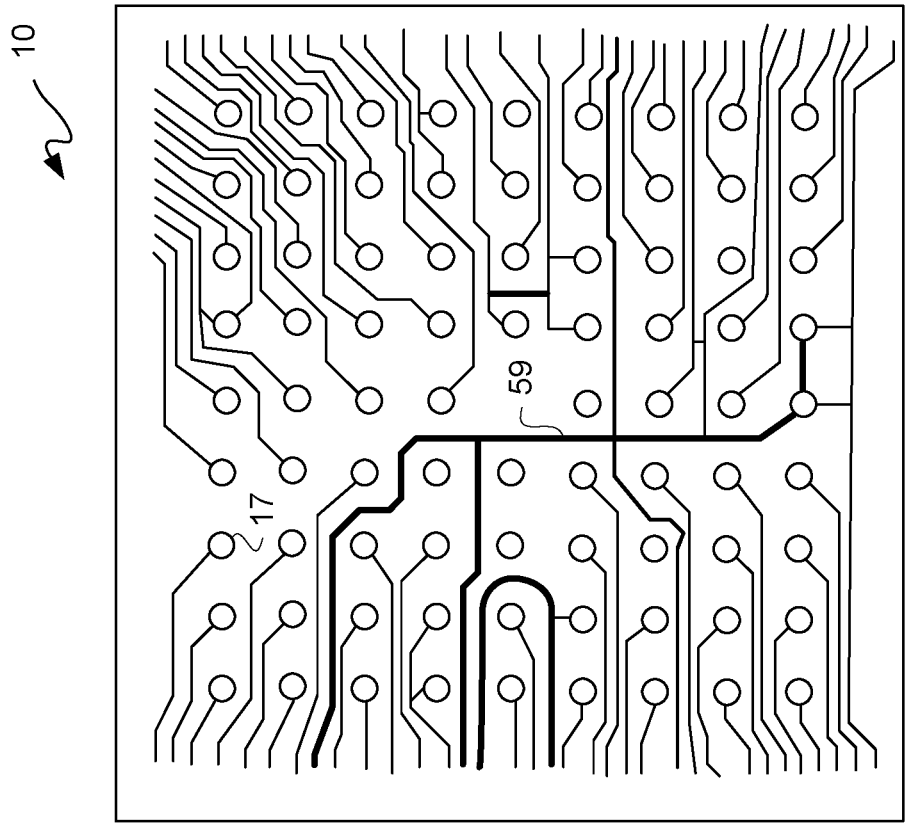
FIG. 6 is a bottom plan view depicting an exemplary conventional image sensor device.
Figure 5:
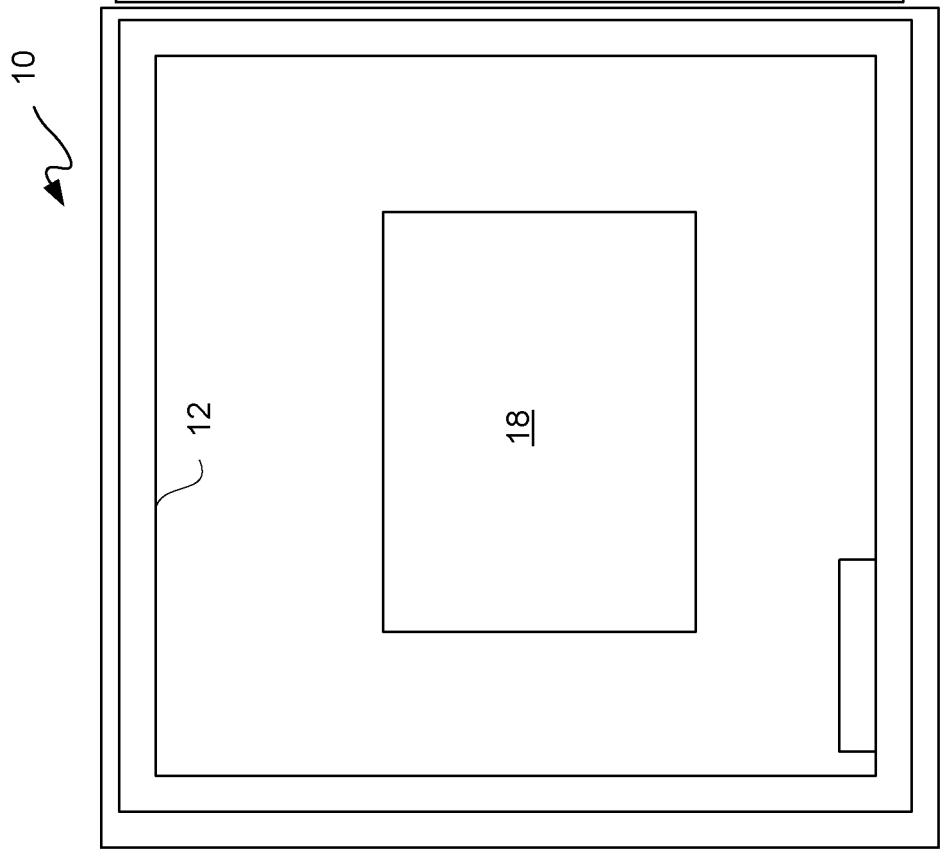
FIG. 5 is a top plan view depicting an exemplary conventional image sensor device.

FIG. 5 is a top plan view depicting an exemplary conventional image sensor device 10, and FIG. 6 is a bottom plan view depicting an exemplary image sensor device 10. In FIG. 5, an image sensing portion, such as a pixel array 18 (center box) of an image sensor device 10 is conventionally located in a middle portion of a substrate 12, and so TSVs 15 conventionally are around a perimeter of image sensor device 10 with bond pads coupled to such TSVs. In other words, because an image sensor device 10 is a sensitive active device during operation, conventionally other circuitry is disposed away from such image sensing portion, such as pixel array 18. However, bumps 17 for coupling to such perimeter of bond pads 16 may be coupled through traces 59 on a back side of such substrate 12 as depicted in FIG. 6.

Bumps 17 and the ball grid array (BGA) at the bottom of the image sensor device shown in FIG. 6 is just one example of how the image sensor device is electrically connected to the motherboard. In another example, the bottom side of the image sensor device is attached to an organic substrate using an adhesive and electrically connected to this organic substrate via wire bonds directly connecting the top of the image sensor to a the organic substrate.

Conventionally, a controller and image processor (not shown) is a separate chip externally coupled to a plurality of bumps 17 of such back side of such substrate 12 as depicted in FIG. 6. Because an image sensor device 10 is conventionally a low-profile device, in the past this has meant having TSVs 15 directly connected to bond pads 16 for direct connection with traces 59 and bumps 17, such as previously described.

To reduce propagation delay between an image sensor device and a controller therefor and provide a low profile device, described below is an image sensor device package having another die embedded with an image sensor device in a common package. In the example below, a controller die ("controller") is embedded with an image sensor device in a common package; however, in another implementation, another type of die, e.g. an image processor die generally used in a camera or other imaging device, may be embedded with an image sensor device in a common package.

Figures 1, 2, 17:
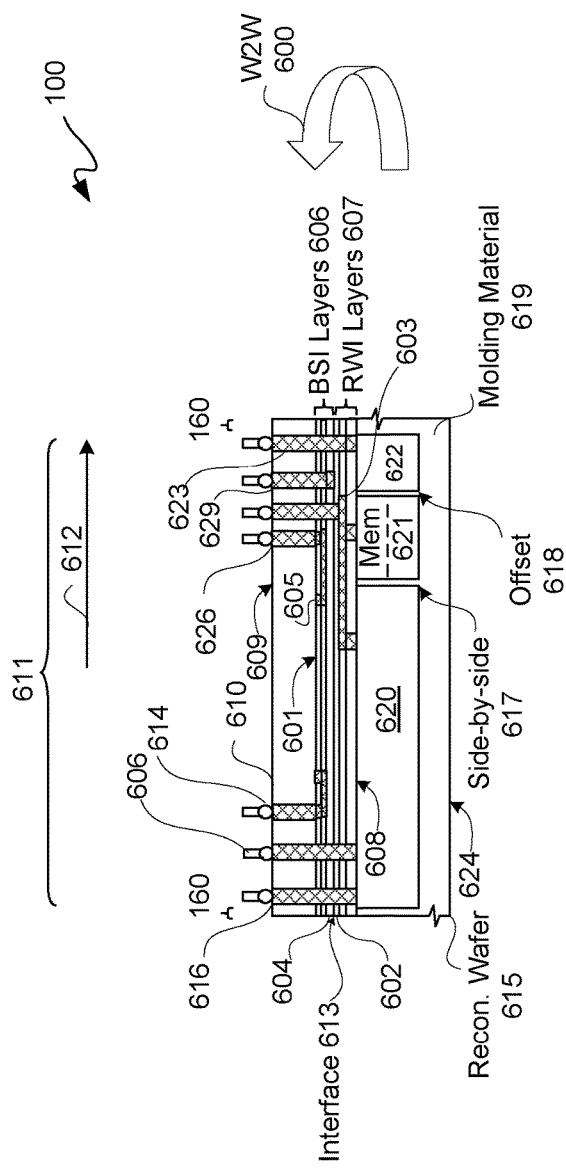
Figures 3, 17:
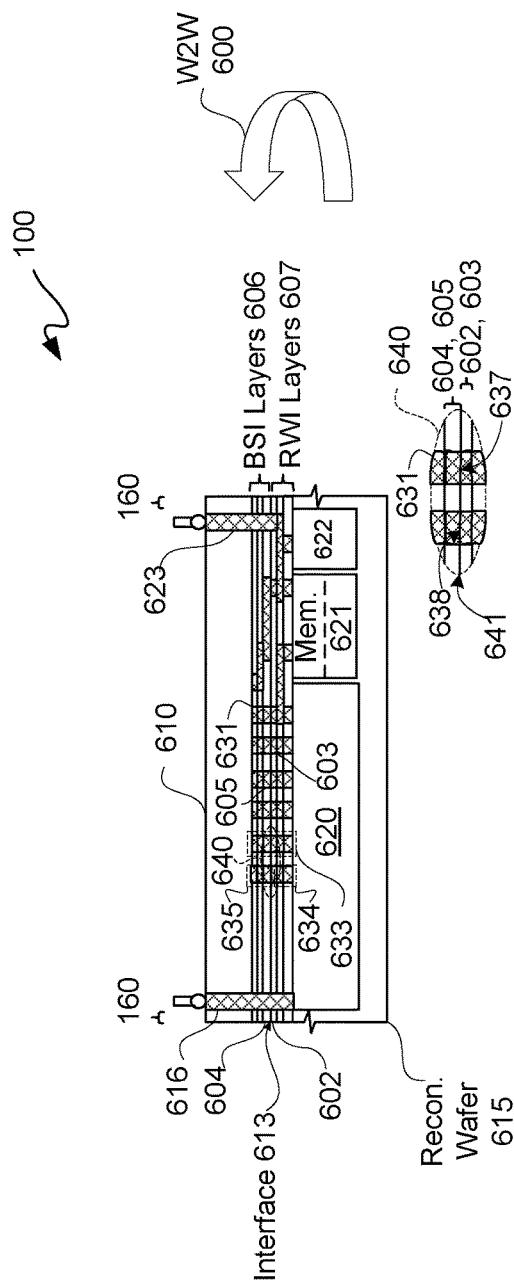
Figures 4, 17:
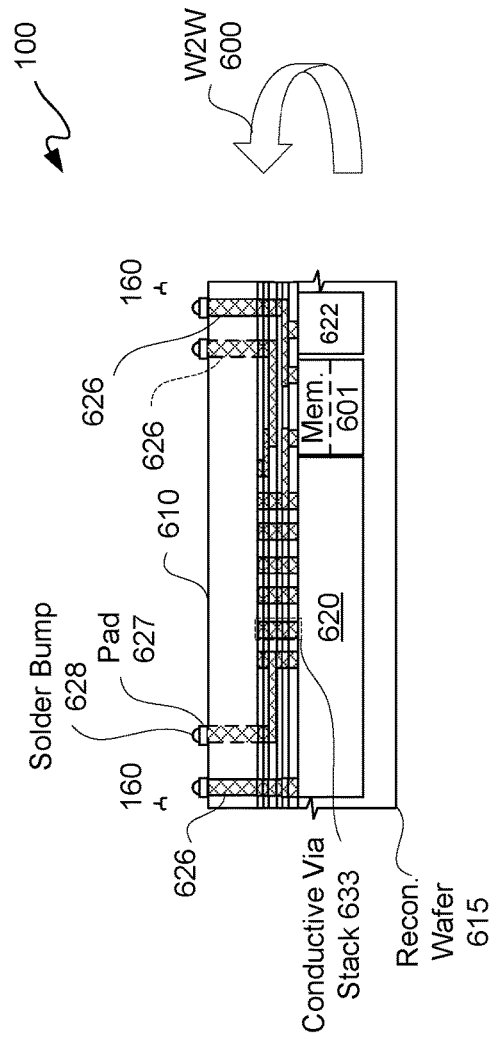
Figures 7, 17:
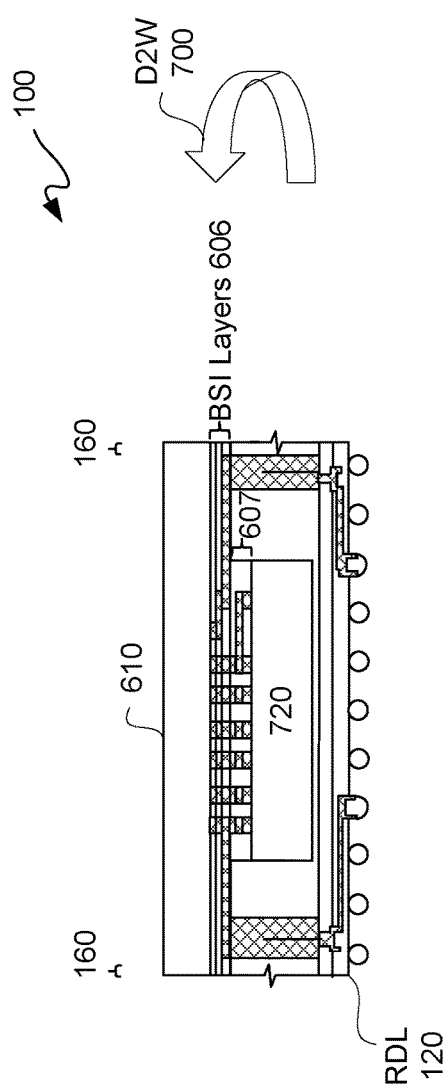
Figures 8, 17:
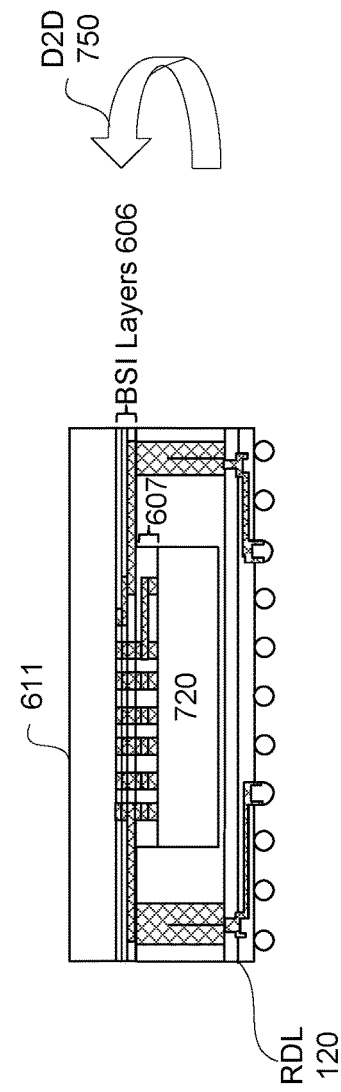
Figures 9, 17:
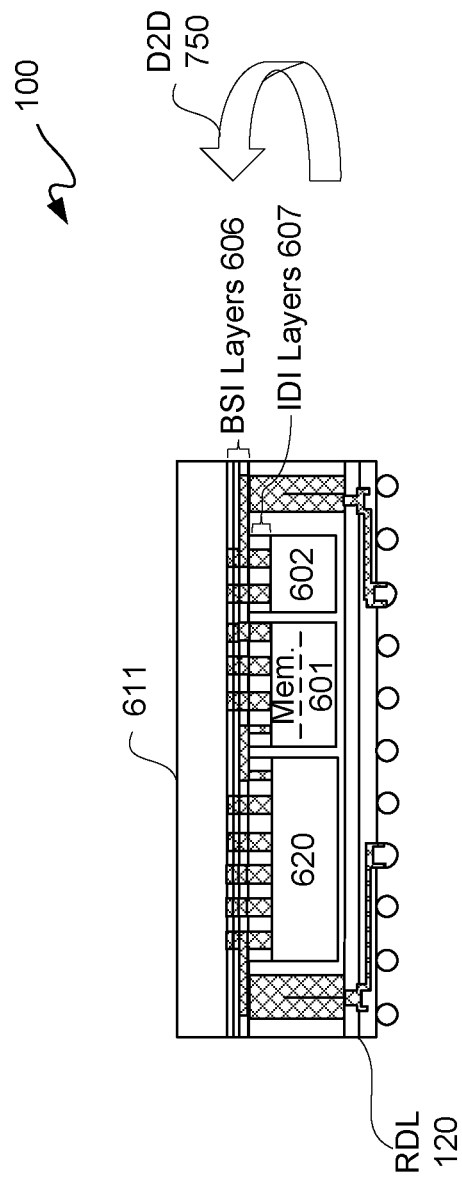

FIG. 7 is a cross-sectional side view illustratively depicting an exemplary image sensor device 100 with dicing lanes 160 for sensor dies 170 in substrate 110, and FIG. 8 is a cross-sectional side view illustratively depicting an exemplary image sensor device 100 with dicing lanes in mold cavities, such as channels, 140. Image sensor devices 100 of FIGS. 7 and 8 are similar. However, in image sensor device 100 of FIG. 8, rather than dicing in lanes of a wafer of substrate 110 having sensor dies 170, dicing through mold cavities 140, namely spaced apart sensor dies 170 defining mold cavities or channels therebetween, may be used. Even though an image sensor die 170 is described, other types of integrated circuit dies having input and/or output signal lines proximally disposed to an outer perimeter thereof may be used.

The implementation of FIG. 8 may be for a reconstituted wafer for substrate 110, whereas the implementation of FIG. 7 may be for a wafer-level process or WLP. Even though either implementation illustratively depicted may be used, for purposes of clarity by way of example and not limitation, the implementation associated with FIG. 7 is generally further described though the implementation associated with FIG. 8 may be understood from the following description.

Figure 9:
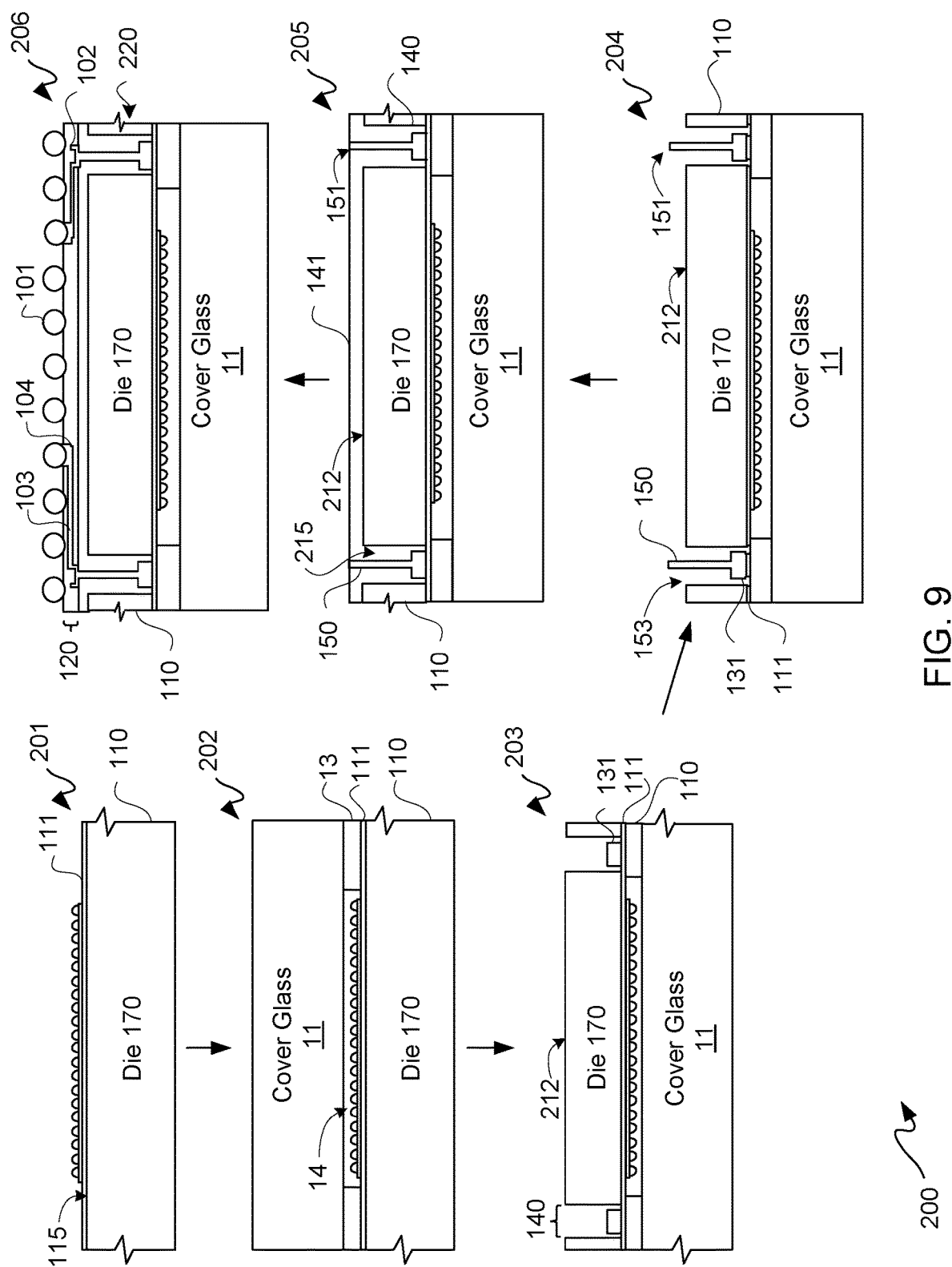
FIG. 9 is a progression of cross-sectional side views illustratively depicting an exemplary process flow, which may be used to form the image sensor device of FIG. 7.

Along those lines, FIG. 9 is a progression of cross-sectional side views illustratively depicting an exemplary process flow 200, which may be used to form image sensor device 100 of FIG. 7. The description herein is for a wafer-level process ("WLP") flow, in contrast to a substrate/chip in a mold or a reconstituted wafer process flow. However, the following description likewise applies to a reconstituted wafer process as shall be apparent to one of skill in the art.

An image sensor wafer or substrate 110 may have multiple image sensor devices to be diced from one another, though only a single image sensor die 170 is illustratively depicted for purposes of clarity and not limitation. As described hereinbelow, slots, channels and/or vias may be formed in such a wafer from and in a back side thereof. In an implementation, a molding material may be deposited, including without limitation injected, along a back side surface of such wafer including into dicing lanes thereof. In another implementation, channels and/or vias are formed in a wafer from a back side thereof; however, these channels and/or vias are not metalized as in a conventional TSV flow. With simultaneous reference to FIGS. 7 through 9, image sensor devices 100 are further described.

At 201, a substrate 110 may be obtained having image sensor dies 170 and a conductive layer, such as a metal layer, 111 may be deposited or otherwise plated onto an upper surface 115 of substrate 110. Substrate 110 may be an optically sensitive/activatable semiconductor wafer having a plurality of sensor dies 170 formed therein. This wafer may be a silicon wafer or other semiconductor wafer. This example implementation is for a "front side" image sensor device 100. Such substrate 110 may have an anti-reflective coating ("ARC"; not shown in this figure for purposes of clarity and not limitation) deposited on upper surface 115, as is known. A metal interconnect layer, namely metal layer 111, on an upper surface 115 of substrate 110 may be used as an etch stop layer for a "via" etch, or more appropriately a channel etch, as described below in additional detail. In this example, only one metal layer 111 is depicted for simplicity; however, this or another implementation may have one or more metal layers to effectively connect diodes under pixels to bond pads 131 at the periphery.

Metal layer 111 may be plated on an active upper surface 115 outside of an optically activatable portion or surface of die 170 for physically coupling to bond pads 131 for electrical conductivity, where bond pads 131 are formed in sensor dies 170 at or proximal to an upper surface or front side surface of substrate 110 as part of an image sensor die fabrication process. For purposes of clarity by way of example and not limitation, a micro lens 22 and a color filter 21 are illustratively depicted in FIGS. 7 through 9 but not described in unnecessary detail for purposes of clarity and not limitation. Generally, electrical connections to diodes under pixels may be established though these metal layers interconnecting such pixels to pads 131. Hence, traces or lines of such metal layers may travel to active areas and pixels. In a front side image sensor die, metal layers are above or on top of diodes, which may obstruct a light path. However, in a back side image sensor die ("BSI sensor"), diodes may be above or on top of such metal layers, namely metal lines are below such diodes. Optionally, stud bumps 130 may formed at 201 to be positioned on metal layer 111 portions corresponding to upper bond pads 131 on a surface thereof opposite wire bond wires 150 to provide additional rigidity to upper bond pads 131.

A glass or cover glass or other optically suited material ("cover glass") 11 may be coupled to a substrate 110 with an adhesive 13 at 202, such as to provide an offset for a cavity 14 for a micro lens 22 and a color filter 21. Adhesive 13 may be used to adhere glass cover 11 to at least one of a conductive layer, such as metal layer 111, or a front side surface 115 of substrate 110, where glass cover 11 is offset from and over an optically-activatable portion of a front side surface 115 for defining a gap, such as air cavity 14, between an underneath side of glass cover 11 and such portion of a front side surface 115. Cover glass 11 may be a glass wafer coupled to an image sensor wafer or substrate 110 using adhesive 13. In an implementation, air cavity 14 may be approximately 50 to 100 microns thick or tall. In another example, no separate cover glass may be coupled to or be a part of an image sensor device.

Adhesive 13 may likewise be around a pixel array area, namely generally proximal to a perimeter of die 170 without being located in a pixel array area. Thus, adhesive 13 may be deposited or otherwise applied to or put in contact with an upper surface of metal layer 111. Adhesive 13 may provide an offset between an upper surface of metal layer 111 and a lower surface of cover glass 11 to define a cavity 14 therebetween, such as previously described.

At 203, a substrate 110, such as a wafer, may optionally be ground, polished, or otherwise thinned to reduce overall thickness prior to drilling or etching channels or slots therein. Further at 203, substrate 110 may be drilled or etched or otherwise formed to provide vias and/or channels or slots ("channels") or mold cavities 140 therein. This channel etching or drilling may be from a back side surface 212 of a wafer or substrate 110 used to form dies 170 down toward a front side surface of such a wafer or substrate 110. In another implementation, etching may form a chamfered edge along one or more sides of dies 170 of substrate 110. Although, side walls of vias or channels are depicted to be vertical side walls, in another implementation such sidewalls may slanted at an angle with respect to the vertical direction.

For etching, a masking layer may be patterned prior to etching using a mask, and this may add additional costs. To avoid this additional cost, direct laser drilling may be used to form channels 140 across a back side surface 212 of a wafer or substrate 110 for multiple image sensor dies 170 thereof. Such channels may be located at or proximal to the peripheries of active areas of image sensor dies 170. Thus, each image sensor die 170 may effectively have a continuous or discontinuous channel 140 around an active area thereof. Channels 140 may extend from a lower surface of substrate 110 completely through to an upper surface of substrate 110, and thus may be thought of as through-substrate channels 140.

Etching or drilling may be used to temporarily expose or reveal surfaces of bond pads 131 generally at the bottom of a channel 140. Whether etching or drilling, metal layer 111, as well as bond pads 131, may be used as a stop layer at 203 for such etching or drilling. Moreover, such etching or drilling may be selective to material of wire bond wires 150, as well as bond pads 131 and metal layer 111.

In this example, bond pads 131 are at least partially disposed within a channel 140. However, for bond pads formed of metal layer 111 for example, a channel 140 may be aligned to bond pads, or vice versa, though at least partially disposed outside a channel 140. Accordingly, generally channels and bond pads are aligned with one another, with such bond pads at or proximal to an upper surface of substrate 110 for access from a lower surface of substrate 110 via a channel 140.

At 204, bond pads 131, which may be formed with a bondable metalization, may optionally be oxide and/or metal etched at a bottom of such channels 140. Along those lines, this etching may be to remove oxidation prior to wire bonding. Optionally, at 204 a metal etch may be used to electrically disconnect two or more bond pads 131 from one another interconnected to one another by metal layer 111. However, generally it may be easier to pattern metal layer 111 and form separate bond pads during a plating/BEOL process. Thus, wire bond wires 150, bond pads 131, and metal layer 111 may be formed of different materials for selectivity to partially etch metal layer 111, which may partially etch bond pads 131 too, while not significantly removing material of wire bond wires 150. In an example, the top metal layer of metal layers 111 may be formed of aluminum and multiple bottom layers may be formed of copper, as wire bonding on aluminum pads is a conventional process.

Bond pads 131 may be disposed around a pixel array. A subsequent optional oxide and/or metal etch at a bottom of such channels 140 may be used to enhance subsequent bonding thereto and/or to physically disconnect bond pads 131 from one another due to metal layer 111, as illustratively depicted at operation 204. However, for purposes of clarity by way of example and not limitation, it shall be assumed that such optional etching is not used in this implementation.

Further at 204, wire bond wires 150 may be bonded to upper surfaces of conductive bond pads 131 along bottoms of channels 140 of a wafer or substrate 110. For a WLP, wire bond wires 150 may be bonded to bond pads 131 located along the base or bases of such one or more trenches or channels 140. Wire bond wires 150 may be ball bonded or use another type of bonding at 204 to bond pads 131.

Wire bond wires 150 may extend vertically away from bond pads 131. After bonding, severing of feed wire of wire bond wires 150 may be performed above channels 140 for having wire bond wires 150 exit channels 140 at the top. Along those lines, tips 151 of wire bond wires may extend above an upper surface 212 of dies 170 of a wafer or substrate 110, namely, extend above an upper opening 153 of channels 140 to be located outside of channels 140, after severing from a feed wire. Such a feed wire may be a copper feed wire for copper bond pads 131. Aluminum or gold wires can additionally or alternatively be used. Optionally, a coated copper wire, e.g. palladium coated copper wire, or other wire bond wire may be used. In another example, tips 151 of wire bond wires 150 may be flush with or even below an upper surface 212 of dies 170.

Rather than using TSVs plated or filled with a conductive material, such as a metal for example, such vias and/or channels 140 may have wire bond wires 150 extending from a bottom or bottoms thereof. Wire bond wires 150 may be of an array, and may be known as BVA™ wires, referring to a "free standing" array of wire bonds. Thus, BVA wire bonds may be disposed in channels 140 with tips 151 extending out of and above such channel openings 153 in a free standing configuration prior to molding. In another implementation, tips 151 may be even with or below channel openings 153.

Another set of bond pads 102, which may be part of or interconnects for a redistribution layer ("RDL") 120, may be formed over filled channels 140, generally on a same plane as a back side surface of die 170. Moreover, bond pads 120 may be formed in or partially in channels 140 to further reduce overall thickness of image sensor devices 100. However, for purposes of clarity by way of example and not limitation, it shall be assumed that bond pads 102 are formed as part of an RDL 120, where such RDL 120 is formed on a molding layer 141, including without limitation an epoxy molding compound, as described below in additional detail. Bond pads 102 may be formed such that they interconnect to tips 151 located above, flushed or below upper surface 212 of a die 170.

Along those lines, each die 170 is in a face-up orientation in FIGS. 7 and 8. By having upper ends (lower ends at operation 204) of wire bond wires 150 and associated upper bond pads 131 disposed generally in a same or common horizontal plane as a face-up front face/front side or active surface 115 of substrate 110, connections from substrate 110, or more particularly dies 170 thereof, to upper bond pads 131 may be formed without having to wire bond down to a lower surface. This common orientation of position may shorten overall wire length for some applications and/or may avoid plating or filling TSVs in substrate 110. Having to wire bond down to a lower surface may be in some package-in-package configurations, such as in U.S. Pat. No. 8,618,659, which is incorporated by reference herein in its entirety for all purposes.

At least a portion of wire bond wires 150 may extend in channels 140, which is referred to as mold cavity 140, as a molding material 215 is deposited, injected, or otherwise loaded into such channels 140 at 205. This mold cavity 140 may be in a mold (not shown) in which one or more singulated in-process image sensor devices 100 are loaded, such as for a reconstituted wafer; or for WLP, channels 140 may be formed along perimeters of dies 170 of substrate 110, such as into image sensor dies 170 proximal to one or more sides thereof. For purposes of clarity by way of example, it shall be assumed that molding for WLP is used for the following description, though the following description generally applies to both implementations.

Deposition of molding material 215 may cover a back side surface or lower surface 212 (an upper surface at operation 205) of die 170 or generally substrate 110, which may include another molding material or coating, to provide molding material ("molding") layer 141. In an implementation, at 205 a wafer or substrate 110 may be transfer molded with molding material 215 with a mold assist film (not shown) to allow tips 151 to extend above an upper surface of molding layer 141. Molding material 205 and molding layer 141 may be formed of the identical material. Film assist molding may be used to keep upper ends 151 of wires 150 from being covered with molding material 215 for subsequent interconnection with lower bond pads 102. With upper ends 151 of wires 150 extending above an upper front face surface of substrate 110, in this example implementation molding material 215 may be deposited and then ground back to provide a planarized surface of molding layer 141 and upper ends 151 of wires 150 for formation of lower bond pads 102.

In another implementation, tips 151 may be completely covered after molding at 205, and back grinding or polishing of an upper surface of molding layer 141 may temporarily expose upper ends 151 of wire bond wires 150 for physical connection with bond pads 102 to be formed.

To recapitulate, wire bond wires 150 may be bonded to upper bond pads 131 at 204 followed by deposition of molding material 215 at 205, and then such upper ends (lower ends with respect to FIGS. 7 and 8) 151 of wire bond wires 150 may subsequently be interconnected to lower bond pads 102, as described below in additional detail.

At 206, bond pads 102 may be formed over upper ends 151 of wire bond wires 150. An RDL 120 may be formed after formation of bond pads 102. RDL 120 may include one or more conductive layers and one or more dielectric layers. Optionally, bond pads 102 may be formed as part of RDL 120. This inverse orientation effectively converts lower bond pads 102 to base bond pads. Thus, base bond pads 102 may be generally in a same or common horizontal plane as a back side lower surface of substrate 110, or more particularly image sensor dies 170 thereof for a WLP. This allows for a face-up configuration of an image sensor die 170 or a substrate 110 with base or lower bond pads 102 being associated with a back side surface of such face-up oriented substrate 110, which is an opposite orientation with respect to that in U.S. Pat. Pub. No. 20140175671 A1, which is incorporated by reference herein in its entirety for all purposes.

As lower bond pads 102 may be formed on molding layer 141, and as RDL 120 may be formed on lower bond pads 102, lower bond pads 102 as well as RDL 120 may not come into direct contact with substrate 110, or more particularly an associated image sensor die 170. In an implementation at 206, traces 103 of RDL 120 may be used to couple a perimeter of lower bond pads 102 to bump pads or receptors 104 for interconnection with associated bumps 101. Accordingly, substrate 110, or more particularly an image sensor die 100, may have a front face up orientation with a shorter wiring path to reduce signal propagation delay for operation of such an image sensor device 100.

Optionally, one or more chips or dies may be coupled to RDL 120, generally at a back side of image sensor device 100 to provide a multi-die or multi-chip image sensor module. Such other chip or die may include an image processor or a controller chip.

One or more operations associated with forming a TSV including forming a dielectric boundary, a barrier layer, a seed layer, and an associated TSV metal plating may be avoided. Having an RDL 120 on one common surface, namely on only mold material of molding layer 141 in this example implementation and on no other material surface, may provide better reliability in comparison to conventional Fan-Out Wafer Level Packaging ("FOWLP"), as for example RDL 120 metal is not transitioned between an Si substrate surface, such as of a wafer or substrate 110, and a molding material surface of molding material 215. Furthermore, a coefficient of thermal expansion ("CTE") of molding material 215, or a combination of molding and/or coating layers, of molding layer 141 may more closely correspond to a PCB material.

Moreover, molding layer 141 may have a larger surface area than substrate 110 for purposes of bump pads 104, namely for purposes of "bumping out" for providing a FO capability. A conventional CMOS image sensor device with TSVs has dimensional restrictions due to locations of such TSVs; however, by avoiding TSVs, these dimensional restrictions may be avoided. Along those lines, more of an edge area around a perimeter of substrate 110 may be etched to make such additional space available for wire bond wires 150 in comparison to TSVs. Along those lines, in another implementation, RDL 120 may extend up (down at operation 206) along sidewalls 220 of substrate 110. In an implementation, RDL 120 may be formed partly on molding layer 141 and partly on substrate 110, like in a FOWLP.

Figure 10:
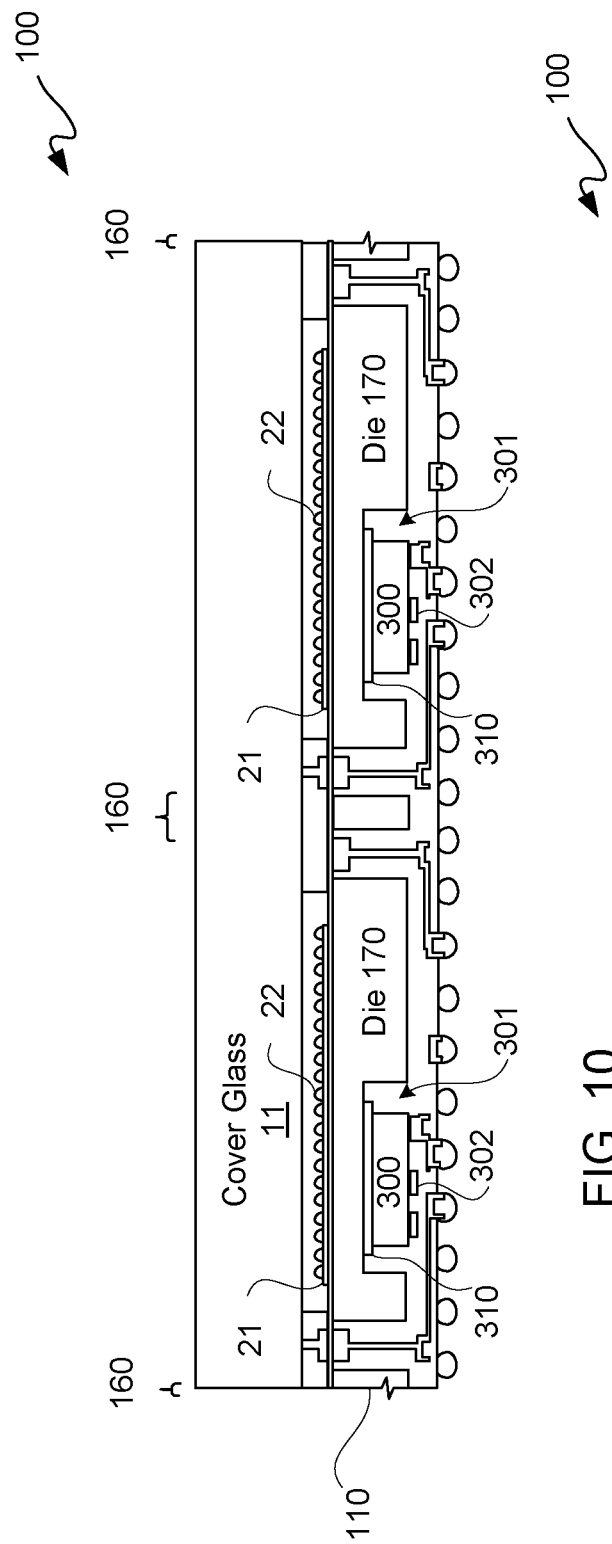
FIG. 10 is a cross-sectional side view illustratively depicting an exemplary image sensor device with dicing lanes for an image sensor die in a substrate and with an optional embedded die.

FIG. 10 is a cross-sectional side view illustratively depicting an exemplary image sensor device 100 with dicing lanes 160 for image sensor dies 170 formed in a substrate 110, where image sensor dies respectively have an optional embedded die 300 coupled to thereto. An embedded die 300 may be a controller die, an image processor die or another chip performing any other functionality that is located in die cavities 301 of corresponding image sensor dies 170. Although only one die 300 and only one cavity 301 is illustratively depicted in FIG. 10, there may be more than one die 300 or more than one cavity 301 at the back side of an image sensor device 100. In another implementation, there may be more than one die in one cavity.

Even though singulation of an image sensor device 100 from a substrate 110 is described herein, in another implementation more than one image sensor die 170 may be used in an image sensor device 100, where such image sensor dies 170 may be coupled to one another after dicing from a substrate 110. Accordingly, such image sensor dies 170 may have a substrate 110 and a glass cover 11 respectively in common with one another after dicing.

Figure 11:
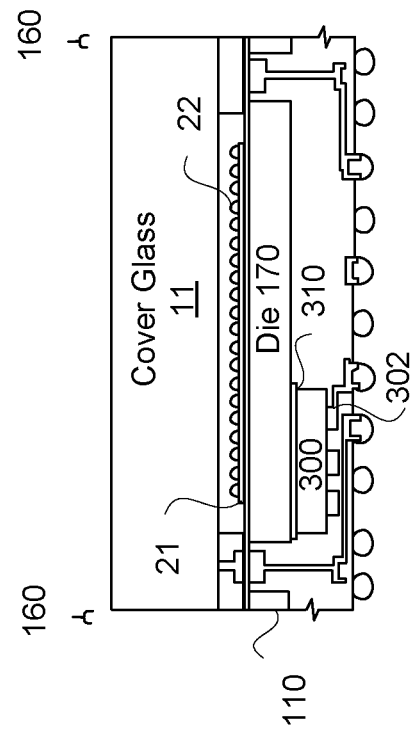
FIG. 11 is a cross-sectional side view illustratively depicting another exemplary image sensor device with dicing lanes for an image sensor die in a substrate and with an optional embedded die.

FIG. 11 is a cross-sectional side view illustratively depicting an exemplary image sensor device 100 with dicing lanes 160 for an image sensor die 170 formed in "thinned" substrate 110 with an optional embedded die 300 coupled to image sensor die 170. Even though a single embedded die 300 is illustratively depicted in FIG. 11, in other implementations more than one embedded die may be used. Furthermore, even though embedded die 300 is described below as a "controller" 300 as associated with a controller for controlling an image sensing device, as described herein, in another implementation embedded die 300 may be a driver or an image processor die. However, for purposes of clarity by way of example and not limitation, it shall be assumed that embedded die 300 is a controller 300. Although only one embedded die 300 is illustratively depicted in FIG. 11, there may be more than one embedded die 300 at the back side of an image sensor device 100.

Figure 12:
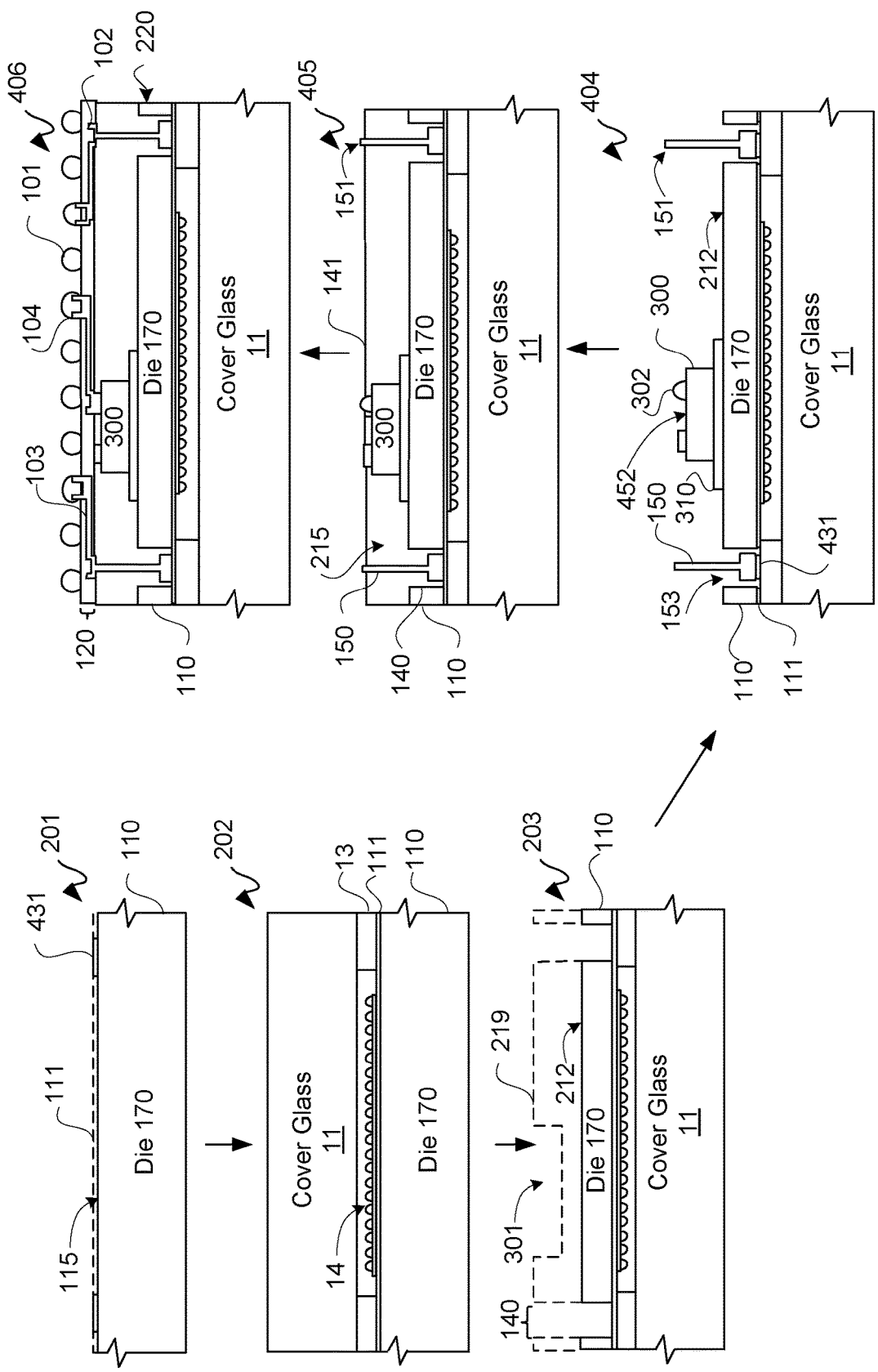
FIG. 12 is a progression of cross-sectional side views illustratively depicting an exemplary process flow, which may be used to form the image sensor device of FIG.

An image sensor device 100 may be provided in a single package with a controller 300 optionally embedded in a packaged image sensor device 100. FIG. 12 is a progression of cross-sectional side views illustratively depicting an exemplary process flow 400, which may be used to form image sensor device 100 of FIG. 11. Even though the following description is for a WLP process 400, the following description may be used in a reconstituted wafer process as shall be apparent to one of skill in the art from the following description.

With simultaneous reference to FIGS. 7 through 12, image sensor devices 100 are further described. Along those lines, as details with respect to image sensor devices 100 of FIGS. 10 through 12 are the same or similar to image sensor devices 100 of FIGS. 7 through 9, some of those same or similar details are not repeated for purposes of clarity and not limitation.

At 201, a metal layer 111 may be deposited or otherwise plated onto an upper surface 115 of substrate 110, such as a wafer having a plurality of sensor dies 170 formed therein, as previously described. Optionally, metal layer 111 may be patterned to provide bond pads 431 for interconnecting to image sensor die 170. However, for purposes of clarity by way of example and not limitation, a continuous metal layer 111 in cross-section is illustratively depicted. Again, optionally, stud bumps 130 may formed at 201 to be positioned on metal layer 111 portions corresponding to upper bond pads 431 on a surface thereof opposite wire bond wires 150 to provide additional rigidity to upper bond pads 431.

Such substrate 110 may have an anti-reflective coating ("ARC"; not shown in this figure for purposes of clarity and not limitation) deposited on upper surface 115, as is known. Again, for purposes of clarity by way of example and not limitation, a micro lens 22 and a color filter 11 are illustratively depicted in FIGS. 10 through 12 but not described in detail for purpose of clarity and not limitation.

At 202, a glass cover glass 11 may be coupled to a substrate 110 with an adhesive 13, as previously described.

At 203, a substrate 110, such as a wafer, may be ground, polished, or otherwise thinned to reduce overall thickness prior to drilling or etching channels or slots therein, as similarly previously described. In this implementation, substrate 110 may be thinned for coupling a controller 300 to a sensor die 170 thereof for a low-profile image sensor 100.

Further at 203, substrate 110 may be laser drilled or wet or dry etched or otherwise formed to provide through channels 140 therein, as previously described. For image sensor device 100 of FIG. 10, a controller die cavity 301 may be formed when forming mold cavities 140 at 203, as generally indicated by dashed line 219. Generally, substrate 110 is much thicker than needed for formation of image sensors for image sensor device 100. Most of this thickness is to provide separation of image sensors of image sensor device 100 from heat and/or interfering signals at an interconnect side of image sensor device 100. However, generally there may be about 10 or fewer wires that interconnect to controller 300, and controller 300 may have a limited amount of circuitry generating heat. Additionally, controller 300 may have a much smaller surface area than an image sensor die 170 of substrate 110. In short, controller 300 may have a small thermal impact. However, in another implementation, an image processor die 300 may be used. Furthermore, controller die cavity 301 may be formed off to one side of substrate 110 to reduce possibility for thermal interference with sensors of a pixel array of image sensor die 170. A controller die 300 may be coupled to a back side surface of substrate 110 to be at least partially in controller die cavity 301.

However, for purposes of clarity by way of example and not limitation, it shall be assumed that image sensor device 100 is formed as described with reference to FIG. 12, as previously stated. Again, channels 140 may be located at or proximal to the peripheries of active areas of image sensor dies 170. Thus, each image sensor die 170 may effectively have a continuous or discontinuous channel 140 around an active area thereof. Again, whether etching or drilling, metal layer 111 may be used as a stop layer at 203.

However, in this example, metal layer 111 is used for providing bond pads, such as bond pads 431. Bond pads 431 may be disposed around a pixel array of sensor die 170. Along those lines, bond pads 431 of metal layer 111 may be formed with a bondable metalization, and a subsequent oxide and/or metal etch at a bottom of such channels 140 may optionally be used to enhance subsequent bonding thereto and/or to optionally physically disconnect bond pads 431 from one another, as illustratively depicted at operation 404. With respect to the former, this etching may be to remove oxidation prior to wire bonding. However, for purposes of clarity by way of example and not limitation, it shall be assumed that such optional etching is not used in this implementation.

At 404, a back side of controller or image processor die 300 may be coupled to a back side of sensor die 170, namely along upper surface 212, with an adhesive 310. Along a front side surface of controller 300, namely upper surface 452, there may be die pads and/or interconnects, generally contacts 302.

Additionally, at 404, wire bond wires 150 may be bonded to upper surfaces of bond pads 431 along bottoms of channels 140 of a wafer or substrate 110. For a WLP, wire bond wires 150 may be bonded to bond pads 431 located along the base or bases of such one or more trenches or channels 140. Wire bond wires 150 may be ball bonded or use another type of bonding at 404 to bond pads 431.

Wire bond wires 150 may extend vertically away from bond pads 431. After bonding, severing of feed wire used to form wire bond wires 150 may be performed above channels 140. Along those lines, tips 151 of wire bond wires may extend above or to an upper surface 452 of controllers 300 adhered to corresponding sensor dies 170 of a wafer or substrate 110, namely, extend above an upper opening 153 of channels 140, after severing from a feed wire.

Again, rather than using TSVs plated or filled with a conductive material, such as a metal for example, such vias and/or channels 140 may have wire bond wires 150 extending from a bottom or bottoms thereof. Wire bond wires 150 may be of an array, and may be known as BVA™ wires. Thus, BVA wire bonds may be disposed in channels 140 with tips 151 extending out of and above such channel openings 153 in a free standing configuration prior to molding. In this implementation, tips 151 may be even with or above upper surface 452 of controller 300, and bond pads 102 for an RDL 120 may be formed on a molding layer 141, as described below in additional detail.

Along those lines, image sensor dies 170 are in a face-up orientation in FIGS. 10 and 11, and controllers 300 are in a face-down orientation in those respective figures. Again, by having upper ends (lower ends at operation 404) of wire bond wires 150 and associated upper bond pads 431 disposed generally in a same or common horizontal plane as a face-up front face or active surface 115 of substrate 110, connections from substrate 110, or more particularly dies 170 thereof, to upper bond pads 431 may be formed without having to wire bond down to a lower surface. This common orientation of position may shorten overall wire length for some applications and/or may avoid plating or filling TSVs in substrate 110. Additionally, by having one or more embedded dies in an image sensor device in a face-down orientation, such one or more embedded dies, such as controller 300 in the examples of FIGS. 10 and 11, may be directly interconnected to a circuit board, such as a PCB, to shorten signal path length. Controller or image processor die 300 in FIGS. 10 and 11 may, though need not be, positioned coaxially with respect to a center of a pixel array of image sensor die 170.

A portion of lengths of wire bond wires 150 extends in channels 140, which is also referred to as mold cavities 140, as a molding material 215 is deposited, injected, transferred or otherwise loaded into such channels 140 at 405. This mold cavity 140 may be in a mold in which singulated in-process image sensor devices 100 are loaded for molding, such as for a reconstituted wafer; or for a WLP, channels 140 may be formed along perimeters of dies 170 of substrate 110, such as into dies 170 proximal to one or more sides thereof, and such substrate 110 may be loaded into a mold for injection molding of a molding layer 141. For purposes of clarity by way of example, it shall be assumed that molding for WLP is used for the following description, though the following description generally applies to both implementations.

Deposition, including without limitation by injection, of molding material 215 may coat a lower surface (an upper surface at operation 405) of substrate 110, which may include another molding material or coating, to provide molding layer 141. In an implementation, at 205 a wafer or substrate 110 may be transfer molded with molding material 215 with a mold assist film (not shown) to allow tips 151 and contacts 302 to extend above an upper surface of molding layer 141. Generally, tips 151 may be above or even with contacts 302.

Film assist molding may be used to reveal tips or upper ends 151 of wires 150 for subsequent interconnection with lower bond pads 102. Such film assist molding may be used to reveal upper end surfaces of contacts 302, as well. With upper ends 151 of wires 150 extending above an upper surface 452 of controller 300 as in this example implementation, molding material 215 may be injection deposited. In this or another implementation, a portion of upper ends of wires 150, as well as contacts 302, may be ground or polished back to planarize for physical interconnection with yet to be formed lower bond pads 102.

To recapitulate, for an image sensor device 100 of FIG. 11, substrate 110 may be thinned, which may be before or after formation of channels 140 or mold cavities 140. After thinning, a controller 300 and/or one or more other dies may be attached back side surface down to a back side surface up oriented thinned substrate 110, and, after thinning and formation of channels 140 for mold cavities 140, formation and boding of wire bond wires 150 may be performed. Attachment of controller or image processor die 300 may include using a thermally insulating adhesive 310 to attach controller 300 to a back side surface of a corresponding image sensor die 170 of substrate 110. After attachment of controller 300 and formation of wire bond wires 150, a molding material 215 may be deposited. Such molding material 215 may be deposited into channels 140 to provide mold cavities 140, as well as into controller or die cavities 301 (if present), and along back side surfaces of image sensor dies 170 of substrates 110 and over a front side surface of controller 300. Wire bond wires 150, along with contacts 302 of controller 300, may extend beyond an upper surface of molding layer 141 by use of a film assisted molding and/or by use of a grinding or polishing operation.

At 406, bond pads 102 may be formed over upper ends 151 of wire bond wires 150. An RDL 120 may be formed after formation of bond pads 102. Optionally, bond pads 102 may be formed as part of RDL 120. Again, image sensor die 170 of FIGS. 10 and 11 is in an inverse orientation, which effectively converts lower bond pads 102 to base bond pads. Thus, base bond pads 102 may be generally in a same or common horizontal plane as a back side lower surface of substrate 110, or more particularly image sensor die 170. This allows for a face-up configuration of an image sensor die 170 or a substrate 110 with base or lower bond pads 102 being associated with a back side surface of such face-up oriented substrate 110

An RDL 120 may be formed on molding layer 141, as previously described, but with contacts 302 interconnected through such RDL 120 and bump pads 104 to bumps 101, and such contacts 302 may be coupled to wires 150 for controlling image sensors of image sensor device 100. As lower bond pads 102 may be formed on molding layer 141, and as RDL 120 may be formed on lower bond pads 102, lower bond pads 102 as well as RDL 120 may not come into direct contact with substrate 110, or more particularly an associated image sensor die 170. In an implementation at 406, traces 103 of RDL 120 may be used to couple a perimeter of lower bond pads 102 to bump pads or receptors 104 for interconnection with associated bumps 101. Accordingly, substrate 110, or more particularly an image sensor device 100, may have a front face up orientation with a shorter wiring path to reduce signal propagation delay for operation of such an image sensor device 100.

Optionally, another chip or die may be coupled to RDL 120, generally at a back side of image sensor device 100 to provide a multi-die or multi-chip image sensor module. Such other chip or die may include an image processor.

One or more operations associated with a dielectric boundary, a barrier layer, a seed layer, and a metal plating associated with forming a TSV may be avoided. Having an RDL 120 on one common surface, namely on only mold material of molding layer 141 in this example implementation and on no other material surface, may provide better reliability in comparison to FOWLP, as for example RDL 120 metal is not transitioned between an Si substrate surface, such as of a wafer or substrate 110, and a molding material surface of molding material 215. Furthermore, a CTE of molding material 215, or a combination of molding and/or coating layers, of molding layer 141 may more closely correspond to a PCB material.

Moreover, molding layer 141 may have a larger surface area than substrate 110 for purposes of bump pads 104, namely for purposes of "bumping out". A conventional CMOS image sensor device with TSVs has dimensional restrictions due to locations of such TSVs; however, by avoiding TSVs, these dimensional restrictions may be avoided. Along those lines, more of an edge area around a perimeter of substrate 110 may be etched to make such additional space available for wire bond wires 150 in comparison to TSVs. Along those lines, in another implementation, RDL 120 may extend up (down at operation 206) along sidewalls 220 of substrate 110. In an implementation, RDL 120 may be formed partly on molding layer 141 and partly on substrate 110, like in a FOWLP.

Figure 13:
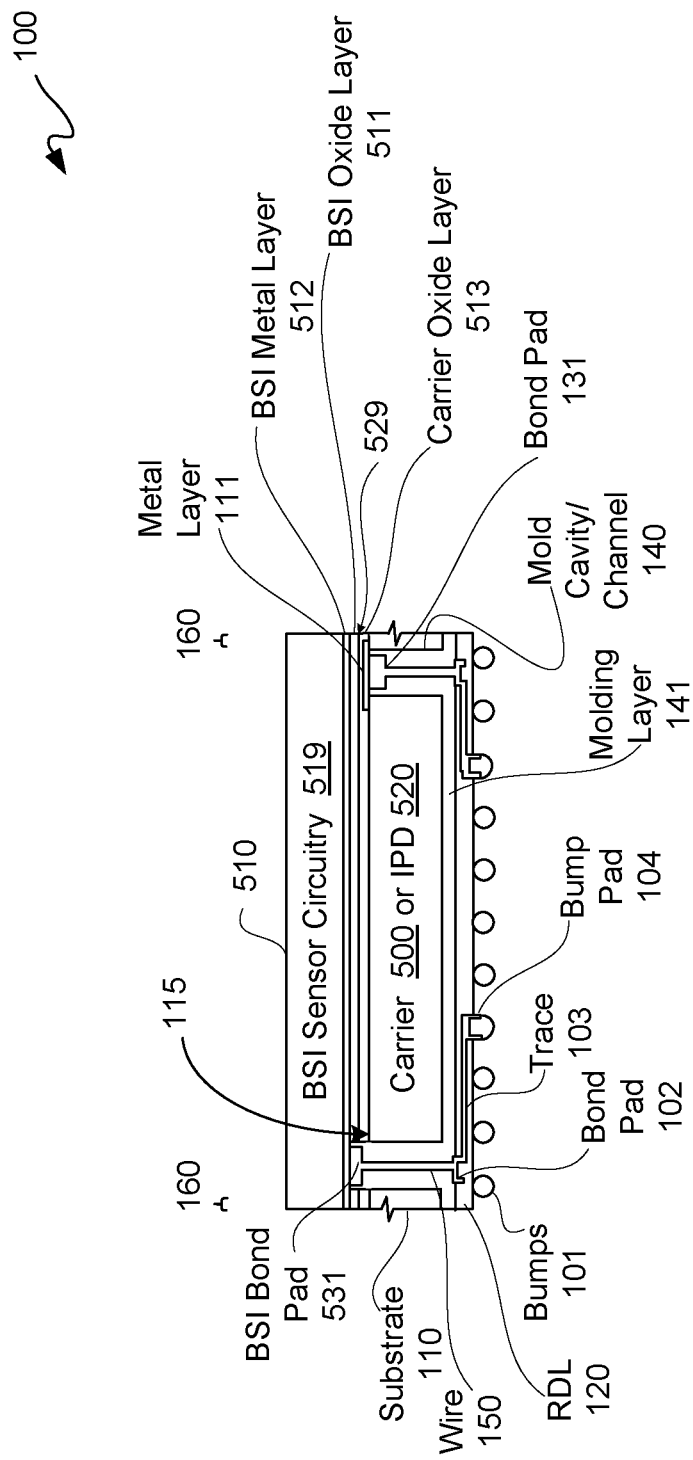
FIGS. 13 through 15 are cross-sectional side views illustratively depicting respective exemplary "back side" image sensor devices with dicing lanes for sensor dies in a substrate.
Figure 14:
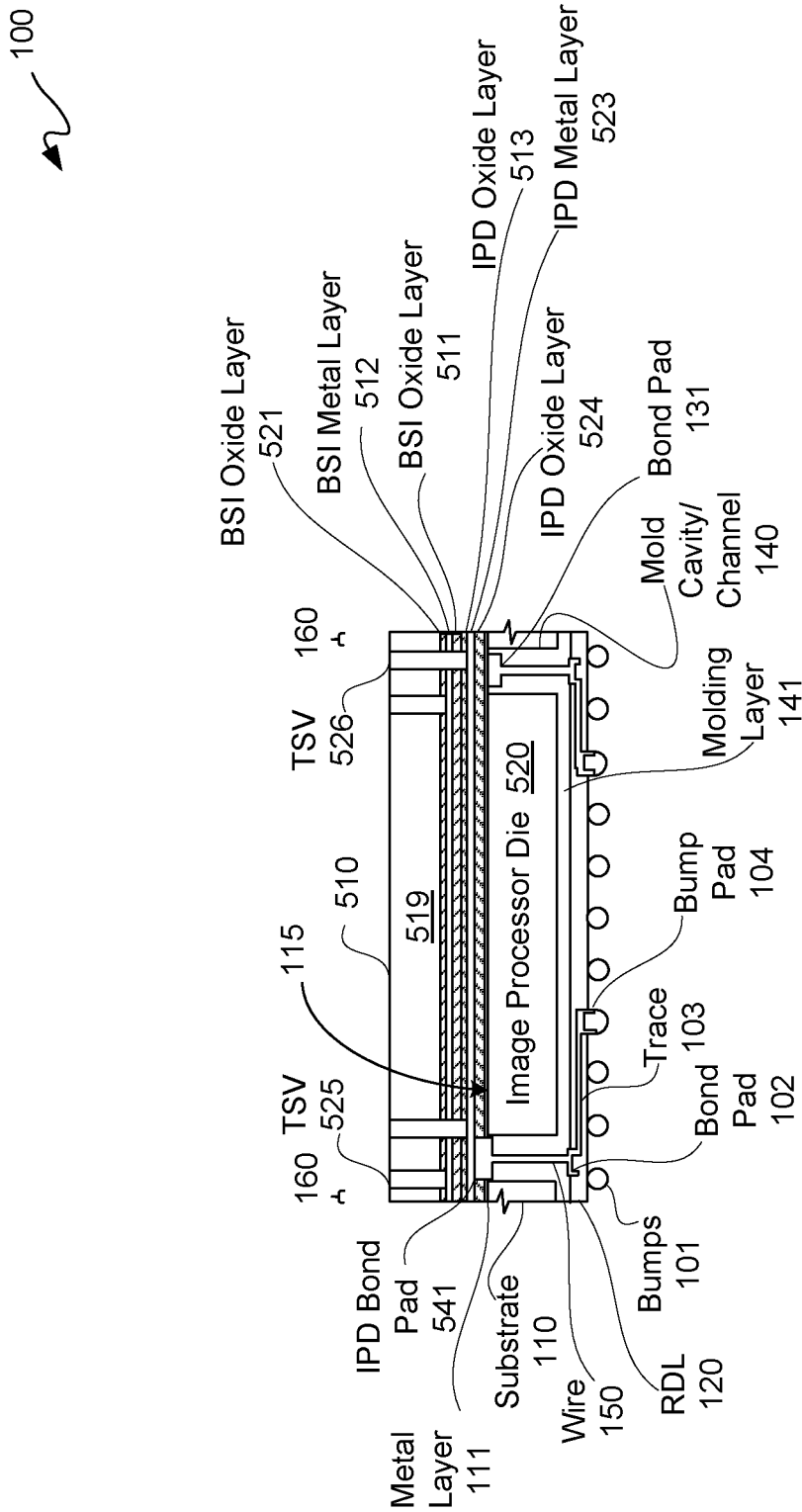
Figure 15:
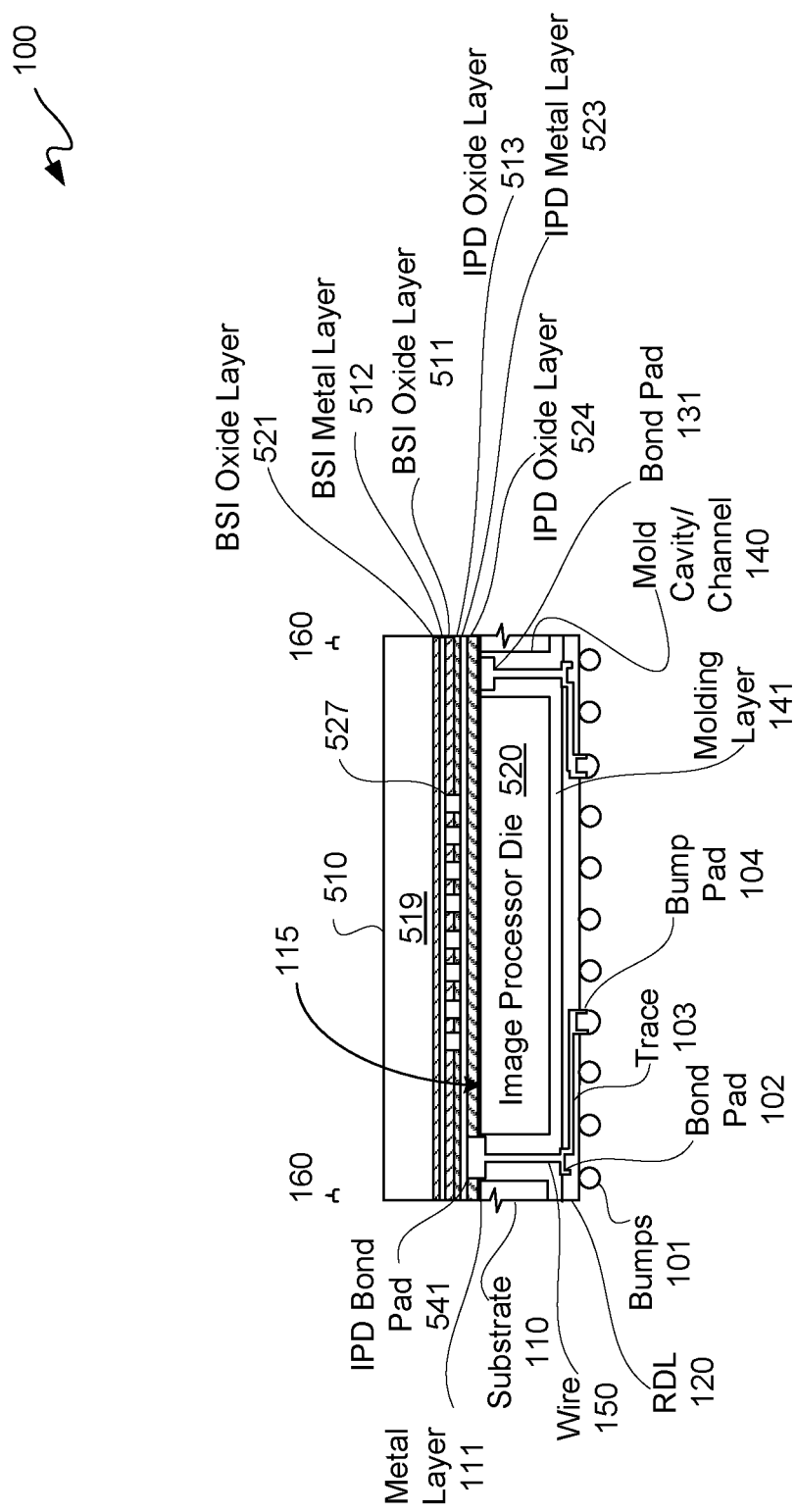

FIGS. 13 through 15 are cross-sectional side views illustratively depicting respective exemplary "back side" image sensor devices 100 with dicing lanes 160. In these exemplary implementations, back side image sensor devices 100 are illustratively depicted. In the exemplary image sensor device 100 of FIG. 13, a substrate 110 is used to provide carriers 500. While carrier 500 may be formed of a semiconductor material, such as Si, GaAs, SiGe, or other form of semiconductor wafer, carriers 500 may be formed of other materials, such as glass or a dielectric material for example.

In contrast, in FIGS. 14 and 15 back side image sensor devices 100 are from a substrate 110 formed of a semiconductor material, such as an Si, GaAs, SiGe, or other form of semiconductor wafer, used to provide image processor dies 520. Though the example herein is generally described in terms of CMOS image processor dies 520, other types of image processor dies may be used.

With reference to FIG. 13, a back side image sensor die ("BSI sensor") 510 is coupled to a substrate 110, where carriers 500, or image processor dies ("IPDs") 520, are formed from such substrate 110. Even though a BSI sensor 510 is described herein, another type of image sensor may be used in other implementations. Moreover, even though the term "die" is used throughout herein, it should be understood that a die may be in a wafer or other substrate having multiple dies. Thus, the term "die" should not be construed to be limited to only after dicing a wafer or substrate, but may include a die yet to be diced.

For purposes of clarity by way of example and not limitation, it shall be assumed that carriers 500 are formed of substrate 110, which may be a wafer. However, in another implementation, IPDs 520 may be formed of substrate 110. As many of the components of image sensor devices 100 of FIGS. 7 and 13 are the same or similar, description of those components is generally not repeated below for purposes of clarity and not limitation.

BSI sensor 510 may include BSI bond pads 531 coupled to a BSI metal layer 512, which may be coupled to BSI sensor circuitry 519. A BSI oxide or other dielectric layer 511 of BSI sensor 510 may be on a side ("underside") of BSI sensor 510. A carrier oxide or other dielectric layer 513 may be deposited on and/or grown from an upper surface 115 of substrate 110.

BSI bond pads 531 of BSI sensor 510 may at least be partially in BSI oxide layer 511 and are in channel 140. Bond pads 131 may be formed as previously described.

A BSI oxide layer 511 to carrier oxide layer 513 interface may be an oxide-to-oxide bond interface 529 for coupling BSI sensor 510 and substrate 110 to one another. Along those lines, this coupling may be done as a wafer-to-wafer coupling for subsequent dicing via dicing lanes 160. Again, though an oxide-to-oxide interface is described in this example, in another example another type of dielectric-to-dielectric interface may be used, which may or may not include an oxide layer.

After coupling BSI sensor 510 and substrate 110 to one another, channels 140 may be etched or drilled using a stop on metal etch to reveal BSI bond pads 531, as well as bond pads 131. Along those lines, metal layer 111 may have openings therein for allowing etching through into oxide layers 511 and 513 to reveal BSI bond pads 531, which may further stop on BSI metal layer 512. Wire bonds of wire bond wires 150 may then be bonded on bond pads 131 and 531 in channels 140, as previously described. Accordingly, channels 140 may be through substrate 110 channels extending at least between front and back side surfaces thereof.

Image sensor devices 100 of FIGS. 13 through 15 may be formed as generally described with reference to exemplary process flow 200 of FIG. 9. Generally, an image sensor 510 may be coupled to substrate 110, such as with an oxide-to-oxide bond for example as described herein. Such image sensor 510 and substrate 110 combination may then be drilled or generally anisotropically etched through substrate 110 and then through oxide layers 513 and 511 with a stop on metal layer 512 for BSI bond pads 531 of FIG. 13. For image sensor devices 100 of FIGS. 14 and 15, such anisotropic etching or drilling is likewise through substrate 110, and then through a dielectric layer 524 for a stop on metal layer 523. Of course chemistries may be changed, including changed in situ, for such etching or drilling to account for etching or drilling different materials. Moreover, even though etching or drilling may be used exclusively, in another implementation a combination of drilling then etching, or vice versa, may be used to form channels 140.

With reference to FIG. 14, a BSI sensor 510 is coupled to a substrate 110, where IPDs 520 are formed from such substrate 110. As many of the components of image sensor devices 100 of FIGS. 7 and 14 are the same or similar, description of those components is generally not repeated below for purposes of clarity and not limitation.

Image processor die ("IPD") 520 may include IPD bond pads 541. IPD bond pads 541 may be coupled to either or both of an IPD metal layer 523 or a metal layer 111. An IPD oxide or other dielectric layer 524 may be formed on metal layer 111, and metal layer 111 may be coupled to IPD circuitry of IPD 520.

An IPD bond pad 541 may be coupled to or formed as part of metal layer 111. IPD bond pad 541 may be at least partially in IPD oxide layer 524. IPD bond pad 541 may be coupled for electrical conductivity with an IPD metal layer 523, and IPD metal layer 523 may be formed on IPD oxide layer 524. IPD oxide layer 513 may be deposited on IPD metal layer 523.

A BSI oxide layer 511 of BSI sensor 510 may be on an underside of BSI sensor 510. Bond pads 131 may be formed as previously described.

BSI sensor 510 may include a BSI metal layer 512 formed between BSI oxide layer 521 and BSI oxide layer 511. A BSI oxide layer 511 to carrier oxide layer 513 interface may be an oxide-to-oxide bond interface, such as previously described, for coupling BSI sensor 510 and substrate 110 to one another. Along those lines, this coupling may be done as a wafer-to-wafer coupling for subsequent dicing via dicing lanes 160.

Moreover, through substrate vias or TSVs 525 and 526 may be respectively interconnected to metal layers 512 and 523. Along those lines, TSVs 526 may go through a substrate of BSI sensor 510 from an upper surface thereof to a lower surface thereof, as well as through IPD oxide layer 513 to IPD metal layer 523. Accordingly, completion of TSVs 526 may be after coupling of BSI sensor 510 and substrate 110 to one another.

After coupling BSI sensor 510 and substrate 110 to one another, channels 140 may be etched or drilled using a stop on metal etch to reveal IPD bond pads 541, as well as bond pads 131. Wire bonds of wire bond wires 150 may then be made on bond pads 131 and 541 in channels 140, as previously described.

With reference to FIG. 15, a BSI sensor 510 is coupled to a substrate 110, where IPDs 520 are formed from such substrate 110. As many of the components of image sensor devices 100 of FIGS. 7, 14 and 15 are the same or similar, description of those components is generally not repeated below for purposes of clarity and not limitation.

IPD 520 may include IPD bond pads 541. IPD bond pads 541 may be coupled to either or both of an IPD metal layer 523 or a metal layer 111. An IPD oxide or other dielectric layer 524 may be formed on metal layer 111, and metal layer 111 may be coupled to IPD circuitry of IPD 520. IPD bond pad 541 may be coupled to or formed as part of metal layer 111. IPD bond pad 541 may be defined, at least in part, in IPD oxide layer 524. IPD bond pad 541 may be coupled for electrical conductivity with an IPD metal layer 523, and IPD metal layer 523 may be formed on IPD oxide layer 524. IPD oxide layer 513 may be deposited on IPD metal layer 523.

A BSI oxide layer 511 of BSI sensor 510 may be on an underside of BSI sensor 510. Bond pads 131 may be formed as previously described.

BSI sensor 510 may include a BSI metal layer 512 formed between BSI oxide layer 521 and BSI oxide layer 511. A BSI oxide layer 511 to carrier oxide layer 513 interface may be an oxide-to-oxide bond interface, such as previously described, for coupling BSI sensor 510 and substrate 110 to one another. Along those lines, this coupling may be done as a wafer-to-wafer coupling for subsequent dicing via dicing lanes 160.

Moreover, metal vias 527 may be respectively interconnected to metal layers 512 and 523. Along those lines, metal vias 527 may go through IPD oxide layer 513 to IPD metal layer 523 and go through BSI oxide layer 511 to BSI metal layer 512. Accordingly, a portion of metal vias 527 may be formed in BSI sensor 510 and another portion of metal vias 527 may be formed in IPD 520, and completion of metal vias 527 may be after coupling of BSI sensor 510 and substrate 110 to one another, which coupling may include a copper-to-copper bonding of corresponding metal via 527 portions to one another.

After coupling BSI sensor 510 and substrate 110 to one another, channels 140 may be etched or drilled using a stop on metal etch to reveal IPD bond pads 541, as well as bond pads 131. Wire bonds of wire bond wires 150 may then be made on bond pads 131 and 541 in channels 140, as previously described.

Figure 16:
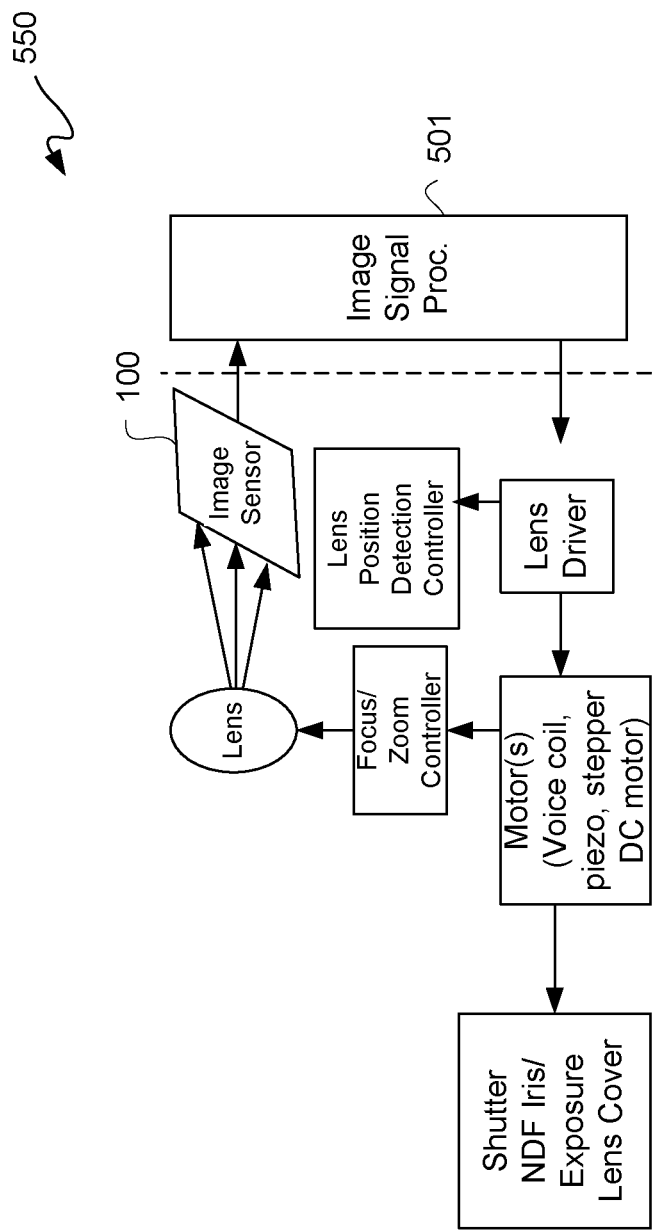
FIG. 16 is a block diagram illustratively depicting an exemplary camera system.

FIG. 16 is a block diagram illustratively depicting an exemplary camera system 550. In camera system 550, an image sensor device 100 is coupled to an image signal processor 501. Other details regarding camera system 550 are well-known, and thus not described for purposes of clarity and not limitation.

FIGS. 17-1 through 17-9 are cross-sectional side views illustratively depicting respective exemplary "back side" image (BSI) sensor devices 100.

Figures 1, 2, 19:
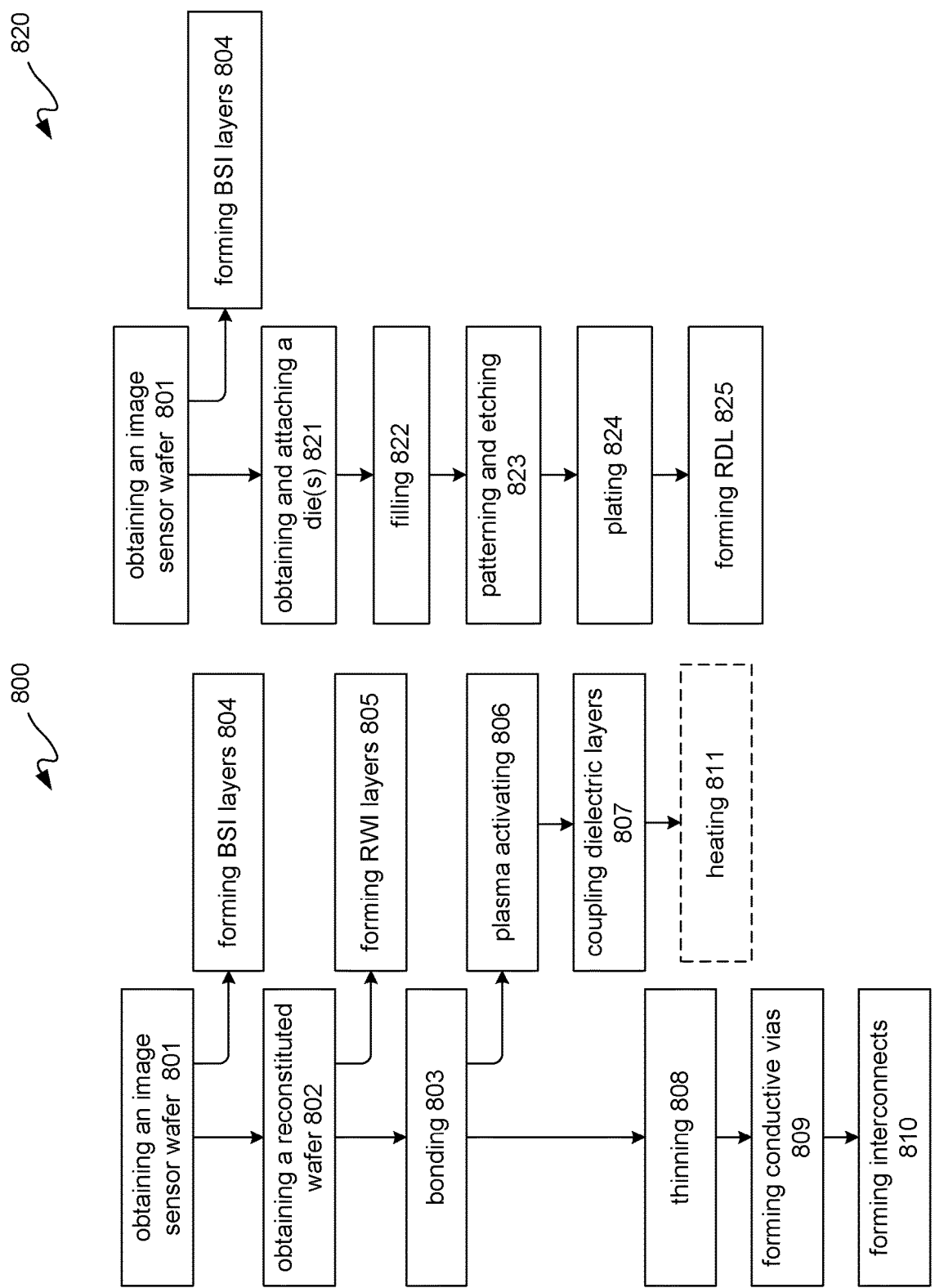
Figures 3, 19:
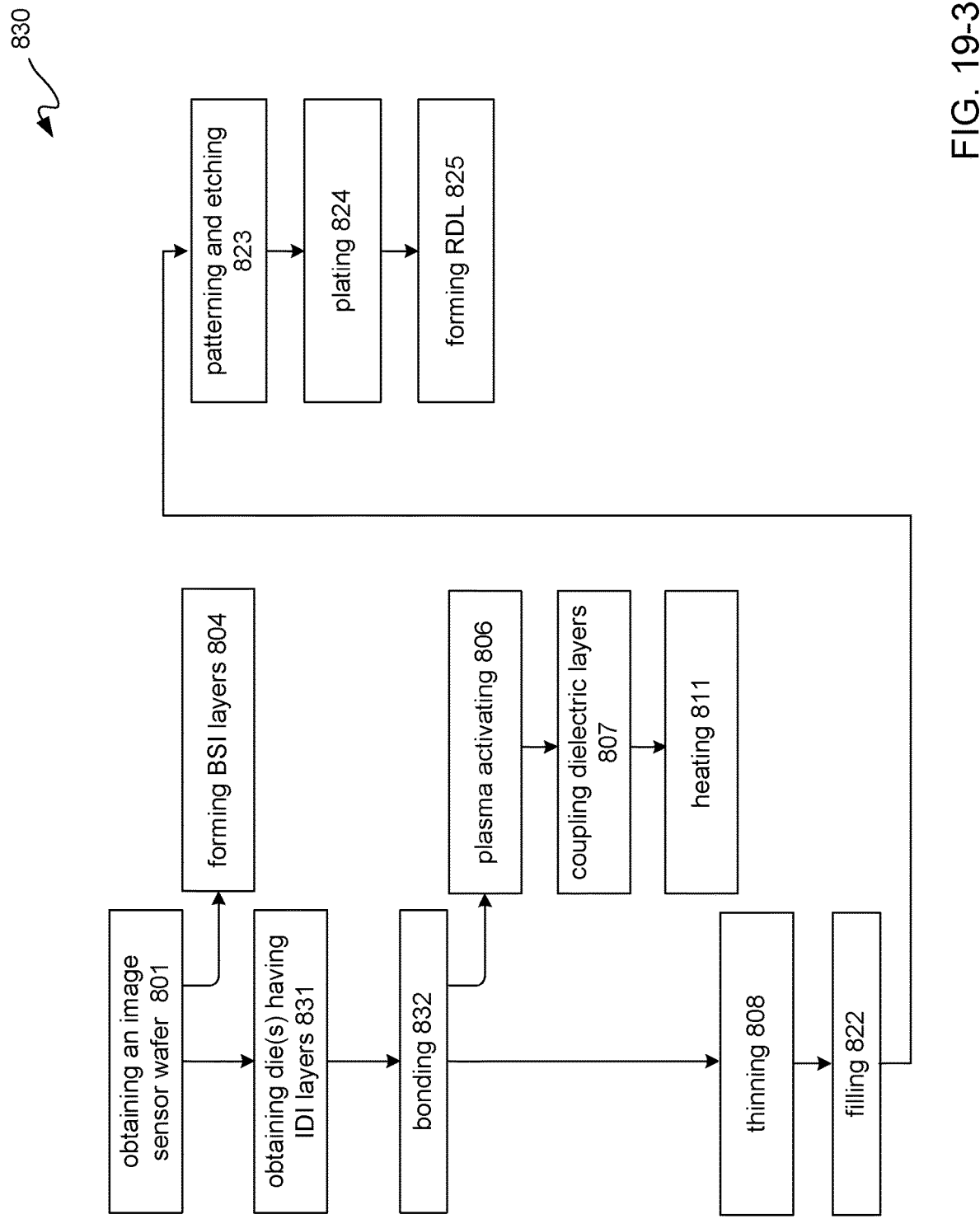

With reference to FIG. 17-1, a wafer-to-wafer ("W2W") assembly 600 of a BSI sensor device 100 is illustratively depicted. BSI sensor device of W2W assembly 600 is further described with simultaneous reference to FIG. 19-1, where there is shown a flow diagram depicting an exemplary assembly flow 800.

At operation 801, an image sensor wafer 610 is obtained. Image sensor wafer 610 includes image sensor dies, such as image sensor die 611 of image sensor wafer 610 for example between dicing lanes 160. Image sensor wafer 610 may have a first diameter, as generally indicated by arrow 612.

At operation 804, if BSI layers 606 are not already present as part of an obtained image sensor wafer 801, BSI layers 606 may be formed layer-by-layer starting on a surface 601 of image sensor wafer 610. In this example, BSI layers 606 include one or two metal layers 605 indicated with cross-hatching and three dielectric layers 604. However, in another example fewer, more, or a same number of dielectric and/or metal layers may be used. In this example, a, which in the depiction is a lowermost, surface of a last dielectric layer 604 of BSI layers 606 opposite image receiving surface 609 may provide a surface for a W2W interface 613, as described below in additional detail.

In this example, image sensor wafer 610 has already been thinned for subsequent use, such as for back side imaging, namely via an image receiving surface 609. Generally, BSI layers 606 may be formed prior to thinning image sensor wafer 610. BSI layers 606 may be formed starting in the depiction from a lowermost surface 601 of image sensor wafer 610 opposite an uppermost or image receiving surface 609 of image sensor wafer 610.

At operation 802, a reconstituted wafer 615 may be obtained. In this example, reconstituted wafer 615 includes a processor die 620 (which may be an image processor die), a memory die or device 621, and generally a control logic ("controller") die 622. However, generally in addition to processor die 620, reconstituted wafer 615 may include one or more functional dies selected from memory dies, controller dies, logic dies, and/or analog dies.

Because image sensor wafer 610 may be separately processed from dies 620 through 622, image sensor wafer 610 may be formed using a substrate or other platform with significantly different dimensions than a wafer substrate used to form dies 620 through 622. For example, image sensor wafer 610 may be of a first diameter associated with formation of image sensing arrays, and processor die 620 may be from a processor wafer of a second diameter different from such first diameter. For clarity by way of non-limiting example, a processor wafer may be a 300 mm diameter wafer, and image sensor wafer 610 may be a 200 mm diameter wafer, or vice versa.

Processor die 620 may be located side-by-side 617 memory die 621 with a gap or offset 618 therebetween for a generally planar topology with reference to an uppermost surface 608 of reconstituted wafer 615. Offset 618 may be less than or equal to one micron.

Similarly, controller die 622 may be located side-by-side 617 memory die 621 with a gap or offset 618 therebetween for a generally planar topology of upper surfaces of dies 620 through 622 with reference to and forming a portion of an uppermost surface 608 of reconstituted wafer 615.

Another portion of uppermost surface 608 may be formed with molding material 619. In this example, a molding material 619 may be injected into a mold with dies 620 through 622 therein for forming a reconstituted wafer 615.

While memory die 621 is generally referenced as a memory die 621 herein, a dashed line thereof is used to indicate that memory die 621 may be a stack of memory dies. For purposes of clarity and not limitation, memory die 621 is referred to herein to be a single memory die or a stack of memory dies.

At operation 805, if reconstituted wafer interface ("RWI") layers 606 are not already present as part of a reconstituted wafer 615, RWI layers 606 may be formed layer-by-layer starting on a surface 608 of reconstituted wafer 615. In this example, RWI layers 607 include one or two metal layers 603 indicated with cross-hatching and three dielectric layers 602. However, in another example fewer, more, or a same number of dielectric and/or metal layers may be used. In this example, a, which in the depiction is an uppermost, surface of a last dielectric layer 602 facing and contacting a last or lowermost surface of a last dielectric layer 604 may provide a W2W interface surface 613, as described below in additional detail.

RWI layers 607 may be formed starting from an uppermost surface 608 of reconstituted wafer 615 opposite a lowermost surface 624 of reconstituted wafer 615. At operation 803, reconstituted wafer 615 and image sensor wafer 610 are bonded to one another.

Along those lines, as part of and prior to actual bonding at operation 803, at operation 806 at least one surface of a lowermost surface of a last dielectric layer 604 of BSI layers 606 or an uppermost surface of a last dielectric layer 602 of RWI layers 607 may be plasma activated for subsequent coupling of such wafers to one another to form interface 613.

For purposes of clarity by way of example and not limitation, dielectric surfaces, such as silicon oxide, silicon carbide nitride, or the like may be polished to low surface roughness, such as using chemical-mechanical polishing (CMP), for "spontaneous" bonding, and nitrogen-based chemistries may be applied through plasma etch processing to plasma activate such one or more surfaces. Such prepared one or more wafer surfaces may then be aligned and placed together, resulting in a "spontaneous" formation of chemical bonds between such wafers. As described below in additional detail, die-to-die ("D2D") or die-to-wafer ("D2W") bonds may likewise be formed. Such bonds may be a strong, low distortion chemical bond. Such bonds may have a bond strength about half the strength of silicon and can be obtained at room temperature. Moreover, a reliable hermetic bond, stronger than silicon, can be obtained after moderate heating, such as to about 150 Celsius, for example. Such an anneal may be performed in batch processing, namely apart from an alignment and placement tool.

At operation 807, such one or more plasma activated surfaces may be placed in contact with one another for coupling. More particularly, at operation 807 of operation 803, a lowermost surface of a last dielectric layer 604 of BSI layers 606 may be coupled to an uppermost surface of a last dielectric layer 602 of RWI layers 607 to form a chemical bond interface 613, namely coupling such wafers to one another by direct bonding at room temperature for a wafer-to-wafer adhesiveless bonding.

Figures 1, 18:
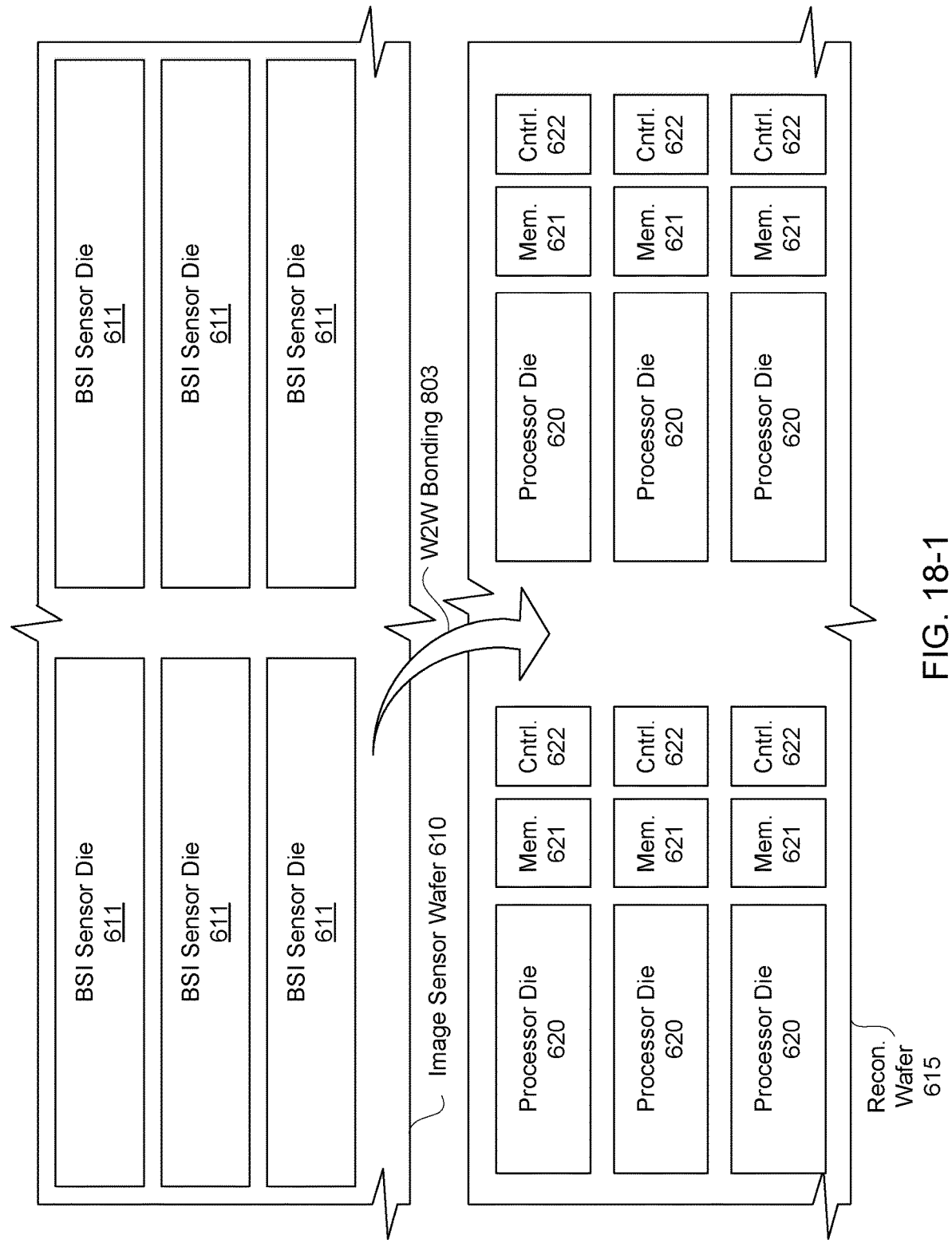
Figures 2, 18:
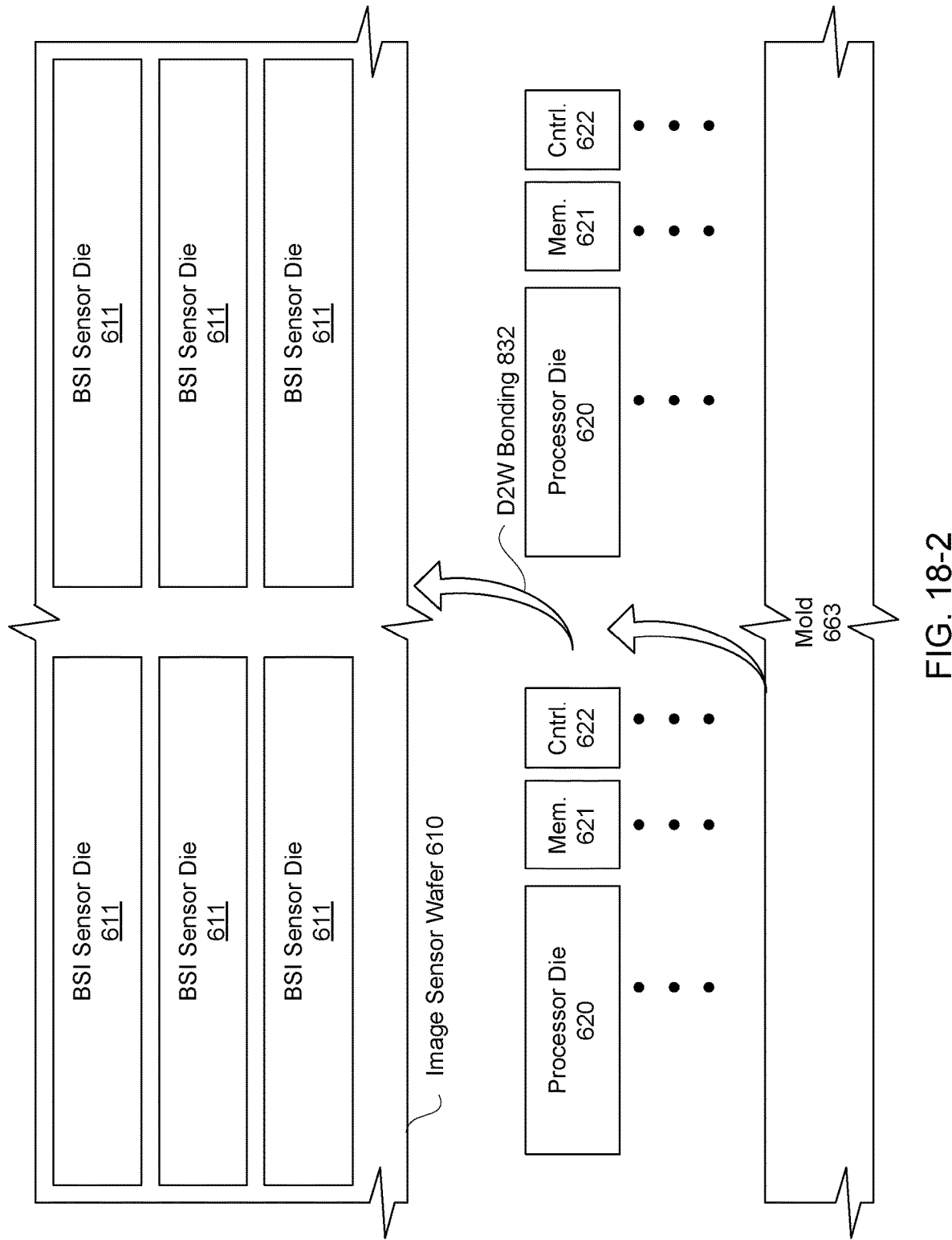
Figures 3, 18:
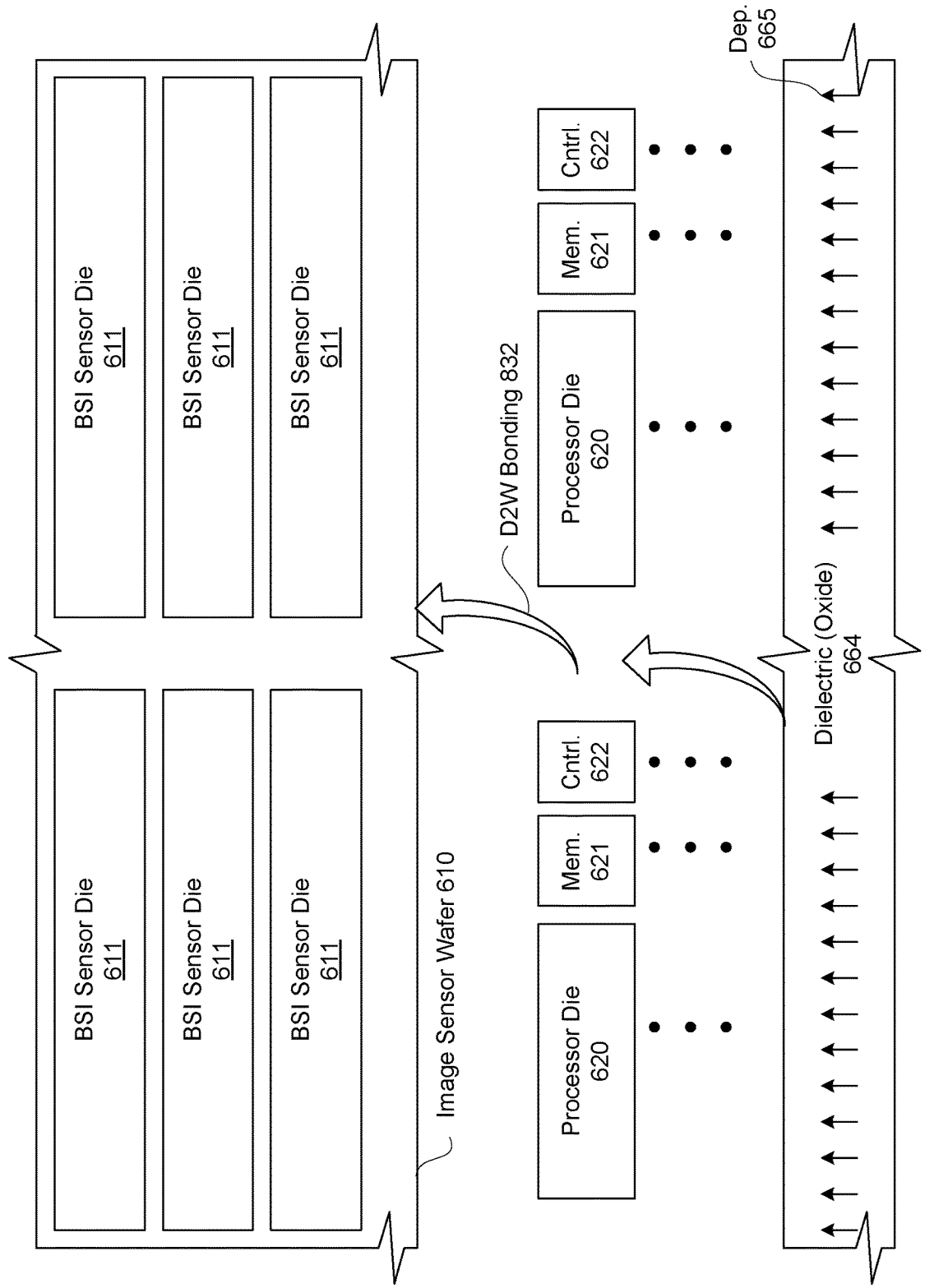
Figures 4, 18:
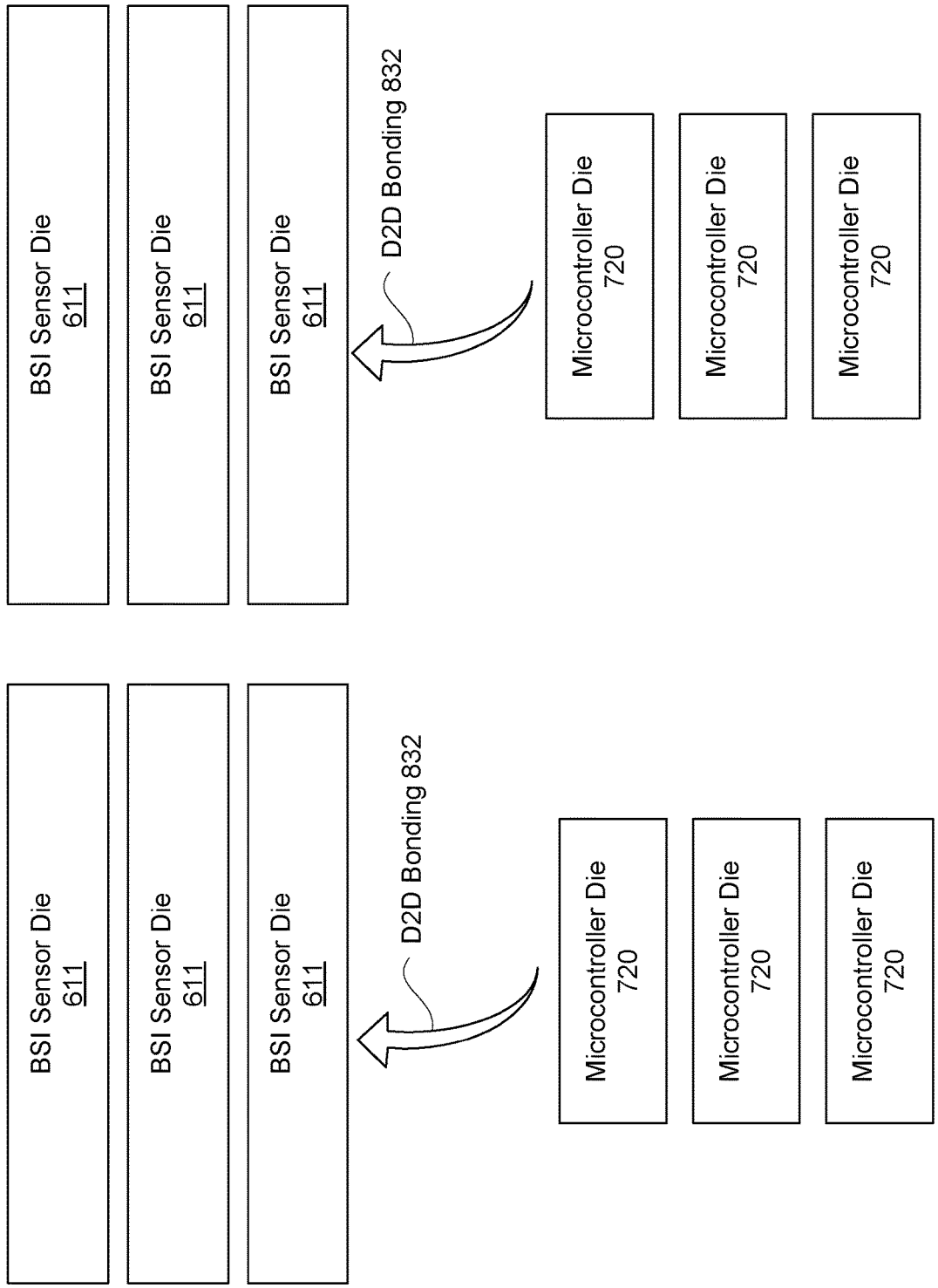
Figures 5, 18:
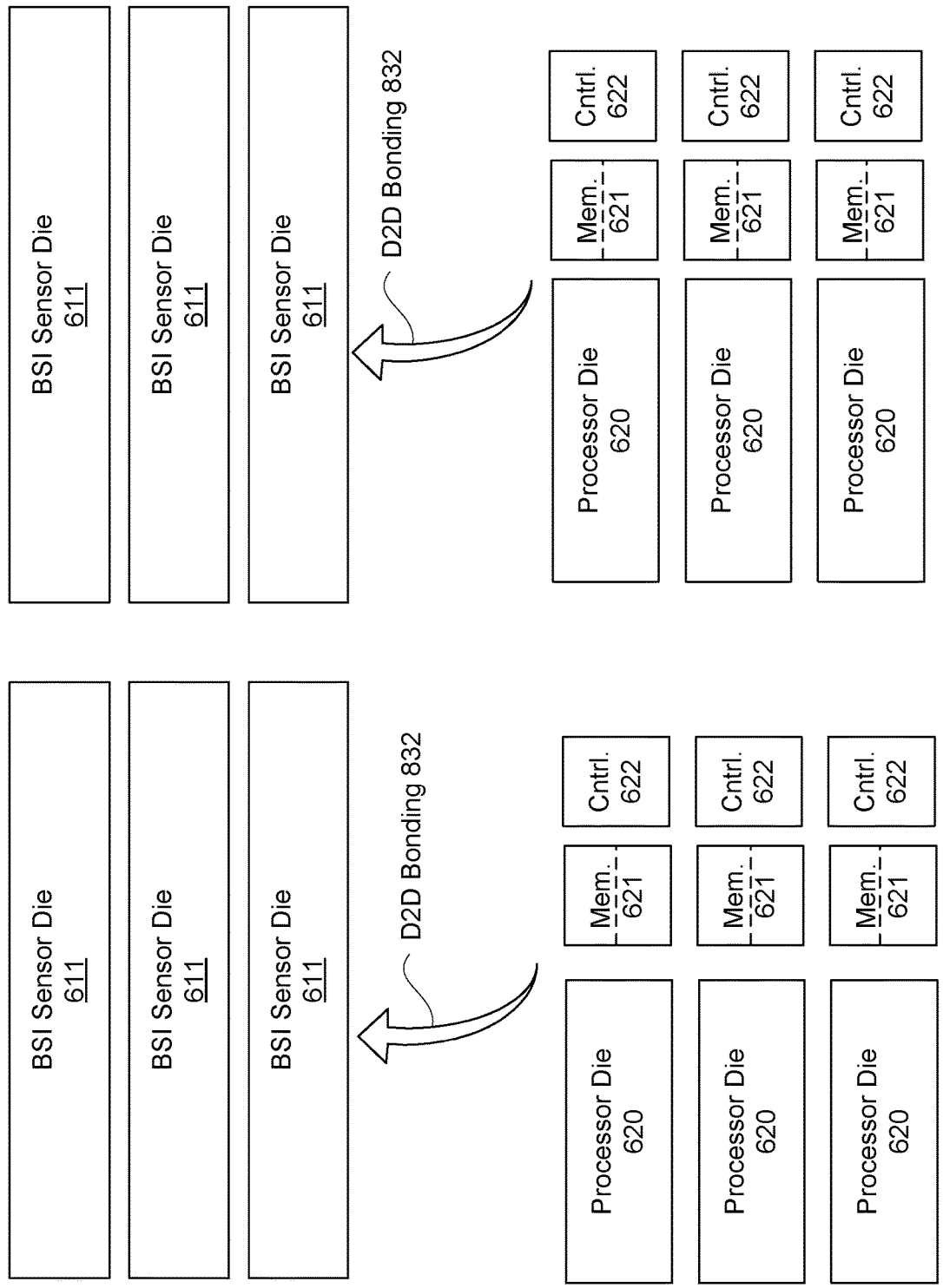

Along those lines, with additional reference to FIG. 18-1, where there is shown a block diagram illustratively depicting an example of a W2W bonding operation 803, an image sensor wafer 610 having BSI sensor dies 611 may have each of such dies coupled to a set of dies 620 through 622 of a reconstituted wafer 615. Reconstituted wafer 615 may include sets of dies 620 through 622 corresponding to BSI sensor dies 611 of image sensor wafer 610.

Optionally, formation of BSI layers at operation 804 and formation of RWI layers at operation 805 may respectively include formation of metallic pads in interfacing dielectric layers 602 and 604. Along those lines, an optional heating, such as annealing, operation 811 may be performed. Formation of metallic pads and optional heating operation 811 is described below in additional detail. Furthermore, an optional heating operation 811 may include or consist of a low temperature anneal to provide a hermetic seal.

After coupling wafers 610 and 615 to one another, at operation 808 a back side, namely along surface 609, of image sensor wafer 610 may be back surface ground to provide back-side thinning to reduce thickness of image sensor wafer 610. While image sensor wafer 610 may be thinned prior to coupling with wafer 615, a thicker assembly may allow thinning at operation 808 to be more reliable, namely less of a possibility of warpage than thinning prior to such coupling.

After thinning at operation 808, conductive vias may be formed at operation 809. In this example, a set of conductive vias 616 are formed to generally extend from an upper surface 609 to a lower surface 608. This set of conductive vias 616 may be for interconnecting for electrical conductivity to processor die 620, such as for power, ground and/or signaling. This set of conductive vias 616 pass through image sensor wafer 610, dielectric layers 604 and dielectric layers 602 as one continuous piece of metal. A continuous piece of metal, in contrast to a stack of metal layers, may at a granular level provide for direct electrical conductivity with less interface resistivity for electrical communication with processor die 620.

Further, in this example, another set of conductive vias 623, which may be formed at operation 809, are formed to generally extend from an upper surface 609 to a surface of a metal layer 603 of metal layers of RWI layers 607. These conductive vias 623 may have same and/or different depths. These conductive vias 623 may go through image sensor wafer 610, dielectric layers 604 of BSI layers 606, and one or more, but not all, of dielectric layers 602 of RWI layers 607 as a continuous piece of metal. Conductive vias 623 may be for interconnecting power, ground, and/or signaling for circuitry of dies 621 and/or 622.

In the above-mentioned example, another set of conductive vias 629 which may be formed at operation 809, may be formed to generally extend from an upper surface 609 to a surface of a metal layer 605 of metal layers of BSI layers 606. These conductive vias 629 may have same and/or different depths. These conductive vias 629 may go through image sensor wafer 610, dielectric layers 604 of BSI layers 606, and none of dielectric layers 602 of RWI layers 607 as a continuous piece of metal. Conductive vias 629 may be for interconnecting power, ground, and/or signaling for circuitry of dies 620, 621, and/or 622.

Further still, in the above-mentioned example, yet another set of conductive vias 626, which may be formed at operation 809, may be formed to generally extend from an upper surface 609 to a surface of a metal layer 605 of metal layers of BSI layers 606. These conductive vias 626 may have same and/or different depths. These conductive vias 626 may go through image sensor wafer 610 and one or more, but not all, of dielectric layers 604 of BSI layers 606 as a continuous piece of metal. Conductive vias 626 may be for interconnecting power, ground, and/or signaling for electrical conductivity with circuitry of image sensor wafer 610.

Conductive vias 616, 623, 626, and 629 may be along a periphery of an array of image sensors of an image sensor die 611 of image sensor wafer 610. Some examples of metal lines of layers 606 and 607, as well as conductive vias 616, 623, 626, and 629, are illustratively depicted for purposes of clarity and not limitation. Along those lines, there may be many more power, ground and signal lines used in an implementation. Furthermore, not all conductive vias need to be along a periphery of an array of image sensors of an image sensor die 611.

At operation 810, interconnects to upper ends of conductive vias 616, 623, 626, and 629 may be formed. In this example, such interconnects are wire bond wires 606 wire bonded with ball bonds 614 to such upper ends of conductive vias 616, 623, 626, and 629. However, in other examples, other types of wire bonds may be used.

With reference to FIG. 17-2, another W2W assembly 600 of a BSI sensor device 100 is illustratively depicted. W2W assembly 600 of BSI sensor device 100 of FIG. 17-2 is further described with simultaneous reference to FIG. 19-1, where there is shown a flow diagram depicting an exemplary assembly flow 800.

W2W assembly 600 of FIG. 17-2 is the same as of FIG. 17-1, except for the following differences. Rather than forming wire bonds at operation 810, at operation 810 interconnects to upper ends of conductive vias 616, 623, 626, and 629 may be formed in this example as conductive pads 627. In this example, such interconnects include conductive pads 627 on such upper ends of conductive vias 616, 623, 626, and 629 with solder bumps, micro pillars or stud bumps 628 respectively on such conductive pads.

With reference to FIG. 17-3, yet another W2W assembly 600 of a BSI sensor device 100 is illustratively depicted. W2W assembly 600 of BSI sensor device 100 of FIG. 17-3 is further described with simultaneous reference to FIG. 19-1, where there is shown a flow diagram depicting an exemplary assembly flow 800.

W2W assembly 600 of FIG. 17-3 is the same as of FIG. 17-1, except for the following differences. Rather than forming interfacing dielectric layers 602 and 604 to provide an interface 613, where each of such dielectric layers when coupling together have no metal layer therein, interfacing dielectric layers 602 and 604 respectively include a metal layer 605 and a metal layer 603.

In this example, each of dielectric layers 604 of BSI layers 606 includes a plurality of metallic pads 631, and each of dielectric layers 602 of RWI layers 607 includes a plurality of metallic pads 631. Metallic pads 631 of dielectric layers 602 and 604 may be vertically aligned to one another to form one or more conductive via stacks 633. Conductive via stacks, sometimes referred to as "chimney stacks" may be distinguished from continuous conductive vias formed by plating or filling a hole to provide a more continuous piece of metal at a granular level, such as may be determined with reference to grain boundaries.

For purposes of clarity by way of non-limiting example, a partial stack 634 of metallic pads 631 of dielectric layers 602 may be vertically aligned to a corresponding partial stack 635 of metallic pads 631 of dielectric layers 604. When interfacing surfaces of partial stacks 634 and 635 are interconnected to one another for electrical conductivity, a conductive via stack 633 may be provided.

Conductive via stacks 633 may be used for electrical communication between for example processor die 620 and circuitry of an image sensor die of image sensor wafer 610. However, conductive via stacks 633 may be used for other electrical communication, such as to or from memory die 621 and/or controller 622 for example.

Along those lines, in this example, shown in more detail in an enlarged portion 640, lower surfaces 638 of a plurality of metallic pads 631 may be along an interfacing surface 641 of interface 613 provided by a metal layer 605 and a dielectric layer 604 of BSI layers 606. Same or similarly, in this example as shown in detail in enlarged portion 640, upper surfaces 637 of a plurality of metallic pads 631 may be along an interfacing surface 641 of interface 613 provided by a metal layer 603 and a dielectric layer 602 of RWI layers 607. Surfaces 638 and corresponding surfaces 637 of facing metallic pads 631 may be directly interconnected to one another for electrical connectivity.

In hybrid direct bonding, for W2W, D2W, or D2D, room temperature bonding may be performed without any pressure or adhesive. During processing, dielectric surfaces, such as for example silicon oxide, silicon nitride, silicon oxynitride and silicon carbide nitride, with embedded metal bond pads, such as of copper or nickel, may be polished along with a corresponding dielectric surface to achieve a low surface roughness. Simultaneously, such metal bond pads may be slightly dished. Polishing and dishing may be achieved using chemical mechanical polishing (CMP). Plasma activation, such as for example with nitrogen-based chemistries, may then be applied using plasma etch tools. Prepared wafers and/or dies can then be aligned and placed together resulting in spontaneous formation of strong chemical bonds between such prepared surfaces. After a batch anneal at operation 811, metal bond pads may expand into one another to form a homogeneous metallic interconnect with grain growth across a bond interface 613. Such a chemical bond between oxides may be significantly strengthened by such an anneal forming metallic interconnects, ensuring high reliability without having to use an underfill.

Because metallic interconnects are formed along interface 613, fewer conductive vias may be formed. In the example of FIG. 17-3, only conductive vias 616 are used. However, conductive vias 616 and/or other types of conductive vias may be used in other examples.

With reference to FIG. 17-4, still yet another W2W assembly 600 of a BSI sensor device 100 is illustratively depicted. W2W assembly 600 of BSI sensor device 100 of FIG. 17-4 is further described with simultaneous reference to FIG. 19-1, where there is shown a flow diagram depicting an exemplary assembly flow 800.

W2W assembly 600 of FIG. 17-4 is the same as of FIG. 17-3, except for the following differences. Rather than forming conductive vias 616 or 623, conductive vias 626 may be formed with underlying conductive via stacks 633 or other underlying one or more metal layers of metal layers 605 and/or 603 of layers 606 and/or 607. This allows shallower holes to be formed, as well as having less depth for lining/plating or otherwise processing such holes to form conductive vias 626. However, in another example, a combination of conductive vias 616, 623, 626, and/or 629 may be used.

Another difference is rather than forming wire bonds at operation 810, at operation 810 interconnects to upper ends of conductive vias 616 may be formed in this example as conductive pads 627. In this example, such interconnects include conductive pads 627 on such upper ends of conductive vias 626; however, in another example upper ends of any combination of conductive vias 616, 623, 626, and/or 629 with solder bumps 628 respectively on such conductive pads may be used.

In the above W2W assemblies 600, image sensor wafer 610 may be of a same or different diameter than that used for formation of any of dies 620 through 622. This flexibility, in contrast to a conventional homogenous-to-homogenous W2W bonding, does not waste as much semiconductor area ("semiconductor real estate"). Along those lines, conventionally for purposes of clarity by way of example, image sensor wafers 610 may be 200 mm diameter wafers, and image sensor dies of such image sensor wafers 610 may be larger in surface area than image processor dies 620, memory dies 621, or controller dies 622, or a combination of horizontal surface areas thereof. Furthermore, dies 620, 621, and/or 622 may be formed on respective 300 mm diameter wafers. Therefore, by using a heterogeneous reconstituted wafer 615, less semiconductor wafer real estate may be wasted due to W2W interfacing of differently dimensioned wafers.

With reference to FIG. 17-5, an example of a D2W assembly 700 of a BSI sensor device 100 is illustratively depicted. D2W assembly 700 of BSI sensor device 100 of FIG. 17-5 is further described with simultaneous reference to FIG. 19-2, where there is shown a flow diagram depicting an exemplary assembly flow 820.

Operations 801 and 804 are as previously described, and thus not repeated. At operation 821, one or more dies may be obtained, such as processor die 620, memory die 621, and controller die 622 for example, and attached to a surface of a lower dielectric layer of BSI layers 606 with a bonding layer 701, such for example an adhesive. Gaps or offsets between sides of such dies, such as previously described, may be present to provide a generally planar topology to an interface 702, namely on at least an upper side of such assemblage of dies. In another example, rather than an adhesive, processor die 620, memory die 621, and/or controller die 622 may have a dielectric layer for a bonding layer 701, where such dielectric layer for example of such processor die 620 has a surface which may or may not be plasma activated for adhesiveless direct bonding as previously described herein and not repeated here for clarity. Such dielectric bonding layer 701 surface of processor die 620 may be put in direct contact with a surface of dielectric layer 604 for formation of an interface 702, where another dielectric layer 744 of processor die 620 on an opposite side of processor die 620 with respect to dielectric bonding layer 701 may having metallic pads 745 for interconnection to an RDL 120.

At operation 822, a bottom-side of such assemblage of dies may be filled, including spacing between and alongside such dies, with a mold material 619, or a dielectric fill (e.g., a deposited oxide), or a dielectric encapsulation material.

In this example, holes 703 are formed in molding material 619 at a patterning and etching operation 823, followed by plating of such holes 703 at operation 824 to form conductive vias 705. Removal of excess plating may be performed as part of plating operation 824.

In another example, conductive pillars 705 may be formed prior to filling with a molding material 619. For example, a resist may be deposited, patterned and etched at operation 823 to form holes in such resist. Then, a plating operation 824 may be performed, including removing excess plating material and removal of such resist. Then a filling operation 822 may be performed to have plated conductive pillars 705.

In this example, holes 703 for conductive vias 705 are etched down through a dielectric layer 604 of dielectric layers of BSI layers 606. However, in another example, holes 703 may be etched down to a metal layer (i.e., stop on metal etch) in such dielectric layer 604, and thus not be etched through any dielectric layer 604.

At operation 825, an RDL 120, as previously described, may be formed. RDL 120 may provide electrical interconnects to conductive vias 705 and contacts of one or more of dies 620 through 622, and RDL 120 may be for an FO-WLP topology.

With reference to FIG. 17-6, an example of a D2W assembly 700 of a BSI sensor device 100 is illustratively depicted. D2W assembly 700 of BSI sensor device 100 of FIG. 17-6 is further described with simultaneous reference to FIG. 19-3, where there is shown a flow diagram depicting an exemplary assembly flow 830.

Operations 801 and 804 are as previously described, and thus not repeated. At operation 831, one or more dies may be obtained, such as processor die 620, memory die 621, and controller die 622 for example, where such dies have RWI layers 831.

At operation 832, such one or more dies obtained at operation 831 may be bonded to an image sensor wafer 610 obtained at operation 801. In this example, each of dies 620 through 622 includes individual die interface ("IDI") layers 607, namely the same as RWI layers 607 but without using a reconstituted wafer. Along those lines, IWI layers 607 may include a metal layer 603 and a dielectric layer 602. For example, metal layer 603 provides a plurality of metallic pads 631 in dielectric layer 602 of processor die 620.

Bonding of dielectric layer 602 and metallic pads 631 of IDI layers 607 to a dielectric layer 604 and corresponding metallic pads of such dielectric layer 604 of a metal layer 605 of BSI layers 606 may be performed as previously described for a W2W bonding, such as may include a plasma activating operation for activating one or more dielectric layer surfaces for an interface 706 and coupling, such as described with reference to operations 806 and 807 for example. Furthermore, an anneal or heating operation 811 may be performed as previously described. Optionally, a conductive via 626 for example may be formed through image sensor wafer 610 through to a metal layer of BSI layers 606.

Gaps or offsets between sides of such dies, such as previously described, may be present to provide a generally planar topology to an interface 706, namely on at least an upper side of such assemblage of dies.

Along those lines, with additional reference to FIG. 18-2, where there is shown a block diagram illustratively depicting an example of a D2W bonding operation 832, and image sensor wafer 610 having BSI sensor dies 611 may have each of such dies coupled to a set of dies 620 through 622. Such sets of dies 620 through 622 may be put in a mold 633 for molding with molding material 619. Such molded dies may include sets of dies 620 through 622 corresponding to BSI sensor dies 611 of image sensor wafer 610.

In another example along those lines, with additional reference to FIG. 18-3, where there is shown a block diagram illustratively depicting another example of a D2W bonding operation 832, and image sensor wafer 610 having BSI sensor dies 611 may have each of such dies coupled to a set of dies 620 through 622. Such sets of dies 620 through 622 may be put have a dielectric, such as an oxide, 664 deposited thereon through a deposition operation 665, as is known. Such dielectric-bound dies may include sets of dies 620 through 622 corresponding to BSI sensor dies 611 of image sensor wafer 610.

A thinning operation of image sensor wafer 610 may be performed, as previously described such as with CMP or other thinning operation, at operation 808.

As previously described, at operation 822, a bottom-side of such assemblage of dies 620 through 622 to an image sensor wafer may be filled, including spacing between and alongside such dies, with a mold material 619, or a dielectric fill (e.g., a deposited oxide), or a dielectric encapsulation material.

In this example, holes 703 are formed in molding material 619 at a patterning and etching operation 823, followed by plating of such holes 703 at operation 824 to form conductive vias 705. Removal of excess plating may be performed as part of plating operation 824.

In another example, conductive pillars 705 may be formed prior to filling with a molding material 619. For example, a resist may be deposited, patterned and etched at operation 823 to form holes in such resist. Then, a plating operation 824 may be performed, including removing excess plating material and removal of such resist. Then a filling operation 822 may be performed to have plated conductive pillars 705. Plated conductive pillars 704 in this example may be for fan-out, wafer-level packaging or FO-WLP.

In this example, holes 703 for conductive vias 705 are etched down to a dielectric layer 604 to stop on a metallic pad a metal layer 605 of BSI layers 606. However, in another example, holes 703 may be etched down through a dielectric layer 604 to a metal layer 605.

At operation 825, an RDL 120, as previously described, may be formed for providing electrical interconnects to conductive vias 705. In the example of FIG. 17-5, dies 620 through 622 are all oriented facing in a downward direction with externally accessible contacts thereof facing away from image sensor wafer 610. However, in the example of FIG. 17-6, dies 620 through 622 are all oriented facing in an upward direction with externally accessible contacts thereof facing image sensor wafer 610.

With reference to FIG. 17-7, another example of a D2W assembly 700 of a BSI sensor device 100 is illustratively depicted. D2W assembly 700 of BSI sensor device 100 of FIG. 17-7 is the same as that of FIG. 17-6, except for the following differences.

Rather than a plurality of dies 620 through 622, a single die 720 having IDI layers 607 is coupled to BSI layers 606, such as described above with reference to FIG. 19-3 through for a single die. A single die 720 allows a single platform for forming IDI layers 607. Otherwise, assembly flow 830 is as previously described.

In this example, single die 720 may be a microcontroller die or a microprocessor die having one or more processor cores, memory and controller circuitry. In another example, single die 720 may be a System-on-Chip (SoC) or other Very Large Scale Integration (VLSI) die. Along those lines, with additional reference to FIG. 18-4, where there is shown a block diagram illustratively depicting an example of a D2D bonding operation 832, and BSI sensor dies 611 may each be coupled to a corresponding singulated die, which in this example is a microcontroller die 720.

With reference to FIG. 17-8, an example of a D2D assembly 750 of a BSI sensor device 100 is illustratively depicted. D2D assembly 750 of BSI sensor device 100 of FIG. 17-8 is the same as D2W assembly 700 of FIG. 17-7, except for the following differences.

Rather than an image sensor wafer 610 having multiple image sensor dies, a diced or singulated image sensor die 611 is obtained and used. Accordingly, operations of assembly flow 830 are as previously described with reference to FIG. 19-3, except at operation 801 rather than obtaining an image senor wafer 610 an image sensor die 611 already having BSI layers 606 may be obtained. Accordingly, operation 804 may be omitted, and operation 831, as previously described, may be for a single die 720 having IDI layers 607.

With reference to FIG. 17-9, another example of a D2D assembly 750 of a BSI sensor device 100 is illustratively depicted. D2D assembly 750 of BSI sensor device 100 of FIG. 17-9 is the same as D2W assembly 700 of FIG. 17-6, except for the following differences.

Rather than an image sensor wafer 610 having multiple image sensor dies, a diced or singulated image sensor die 611 is obtained and used. Accordingly, operations of assembly flow 830 are as previously described with reference to FIG. 19-3, except at operation 801 rather than obtaining an image senor wafer 610 an image sensor die 611 already having BSI layers 606 may be obtained. Accordingly, operation 804 may be omitted, and operation 831, as previously described, may be for a single die 720 having IDI layers 607. Along those lines, with additional reference to FIG. 18-5, where there is shown a block diagram illustratively depicting an example of a D2D bonding operation 832, BSI sensor dies 611 may each be coupled to a corresponding set of dies 620 through 622.

Again, image sensor die 611 may be from an image sensor wafer having a different or same diameter as wafers used for forming any or all of dies 620 through 622, such as processor die 620 for example. Again, flexibility provided by using individual dies in a D2D assemblage may be useful in reducing wastage with respect to semiconductor real estate.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:
1. A method, comprising:
obtaining an image sensor wafer having a first dielectric layer with a first surface;
obtaining a reconstituted wafer having a processor die and a second dielectric layer with a second surface;

wherein the reconstituted wafer comprises the processor die, a controller die and a memory die structurally coupled to one another with a molding material to provide the reconstituted wafer; and bonding the reconstituted wafer and the image sensor wafer to one another including coupling the first surface of the first dielectric layer and the second surface of the second dielectric layer.

2. The method according to claim 1, further comprising forming a set of conductive vias including through the image sensor wafer, the first dielectric layer and the second dielectric layer for electrical conductivity with the processor die.

3. The method according to claim 2, wherein the set of conductive vias is a first set of conductive vias, the method further comprising forming a second set of conductive vias including through the image sensor wafer but not through the second dielectric layer for electrical conductivity with the image sensor wafer.

4. The method according to claim 1, further comprising:
plasma activating at least one of the first surface of the first dielectric layer or the second surface of the second dielectric layer before the bonding; and
the bonding includes placing the first surface and the second surface in contact with one another for a wafer-to-wafer direct bonding at room temperature without any adhesive between the first surface and the second surface.

5. The method according to claim 4, further comprising thinning a back side of the image sensor wafer.

6. The method according to claim 1, wherein:
the first dielectric layer includes a first plurality of metallic pads;
the second dielectric layer includes a second plurality of metallic pads; and
the coupling comprises interconnecting first surfaces of the first plurality of metallic pads of the first surface and second surfaces of the second plurality of metallic pads of the second surface directly to one another for electrical connectivity.

7. The method according to claim 6, wherein the bonding is a wafer-to-wafer adhesiveless direct bonding of the image sensor wafer and the reconstituted wafer.

8. The method according to claim 6, further comprising forming conductive vias with a continuous piece of metal extending through the image sensor wafer, the first dielectric layer and the second dielectric layer for electrical conductivity with the processor die.

9. The method according to claim 6, further comprising forming conductive vias with a continuous piece of metal including extending through the image sensor wafer and the first dielectric layer and not through the second dielectric layer.

10. The method according to claim 6, further comprising forming conductive vias with a continuous piece of metal including extending through the image sensor wafer.

11. A method, comprising:
obtaining an image sensor reconstituted wafer having a plurality of image sensor devices structurally coupled to one another with a molding material and having a first dielectric layer with a first surface;
obtaining a processor die having a second dielectric layer with a second surface;
the first dielectric layer including a first plurality of metallic pads of a first metal layer;
the second dielectric layer including a second plurality of metallic pads of a second metal layer;

bonding the processor die and the image sensor reconstituted wafer to one another including coupling the first surface of the first dielectric layer and the second surface of the second dielectric layer to one another; and
the coupling comprising interconnecting first surfaces of the first plurality of metallic pads of the first surface and second surfaces of the second plurality of metallic pads of the second surface directly to one another for electrical connectivity.

12. The method according to claim 11, wherein the second dielectric layer of the processor die is directly bonded to the first dielectric layer of the image sensor reconstituted wafer without any adhesive between the first surface and the second surface.

13. The method according to claim 12, further comprising:
depositing a dielectric material around sides of the processor die; and
forming conductive pathways through the dielectric material coupled for electrical conductivity to at least one of a plurality of metal layers of the image sensor reconstituted wafer before or after the depositing.

14. The method according to claim 13, wherein the conductive pathways are plated pillars or vias, the method further comprising forming a redistribution layer on the dielectric material and interconnected to the conductive pathways for electrical communication.

15. The method according to claim 12, further comprising:
obtaining a memory die having a third dielectric layer with a third surface;
the third dielectric layer including a third plurality of metallic pads of a third metal layer;
bonding the memory die and the image sensor reconstituted wafer to one another including coupling the first surface of the first dielectric layer and the third surface of the third dielectric layer to one another; and
the coupling comprising interconnecting other first surfaces of the first plurality of metallic pads of the first surface and third surfaces of the third plurality of metallic pads of the third surface directly to one another for electrical connectivity.

16. The method according to claim 11, further comprising:
depositing a dielectric material around sides of the processor die; and
forming a set of conductive vias including through the image sensor reconstituted wafer for electrical conductivity to at least one of a plurality of metal layers of the image sensor reconstituted wafer.

17. A method, comprising:
obtaining an image sensor wafer having a first dielectric layer with a first surface;
obtaining a processor die having a second dielectric layer with a second surface;
the first dielectric layer including a first plurality of metallic pads of a first metal layer;
the second dielectric layer including a second plurality of metallic pads of a second metal layer;
the processor die having a third surface opposite the second surface; and
bonding the processor die and the image sensor wafer to one another including coupling the first surface of the first dielectric layer of the image sensor wafer and the third surface of the processor die.

18. The method according to claim 17, further comprising applying an adhesive to at least one of the third surface or the first surface for the bonding.

19. The method according to claim 17, wherein the processor die has a third dielectric layer having the third surface, the method further comprising:
- plasma activating at least one of the first surface of the first dielectric layer or the third surface of the third dielectric layer before the bonding; and
- the bonding includes placing the first surface and the third surface in contact with one another for a direct bonding at room temperature without any adhesive between the first surface and the third surface.

20. The method according to claim 17, further comprising:
- depositing a dielectric material around sides of the processor die: and
- forming conductive pathways for electrical conductivity to at least one of a plurality of metal layers of the image sensor wafer before or after the depositing.

* * * * *